United States Patent
Lee et al.

(10) Patent No.: US 9,159,432 B2
(45) Date of Patent: Oct. 13, 2015

(54) METHOD OF PROGRAMMING A NONVOLATILE MEMORY DEVICE

(71) Applicant: SAMSUNG ELECTRONICS CO., LTD., Suwon-Si, Gyeonggi-Do (KR)

(72) Inventors: Chang-Hyun Lee, Suwon-si (KR); Jee-Yeon Kang, Seongnam-si (KR); Dong-Hoon Jang, Seoul (KR); Jung-Dal Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 148 days.

(21) Appl. No.: 13/790,409

(22) Filed: Mar. 8, 2013

(65) Prior Publication Data

US 2013/0258771 A1    Oct. 3, 2013

(30) Foreign Application Priority Data

Mar. 29, 2012  (KR) .................. 10-2012-0032108

(51) Int. Cl.
  *G11C 16/24*  (2006.01)
  *G11C 16/04*  (2006.01)
  *G11C 16/10*  (2006.01)

(52) U.S. Cl.
  CPC ............ *G11C 16/24* (2013.01); *G11C 16/0483* (2013.01); *G11C 16/10* (2013.01)

(58) Field of Classification Search
  CPC .............................. G11C 16/24; G11C 16/10
  USPC ............................ 365/185.17, 185.25, 185.2
  See application file for complete search history.

(56) References Cited

U.S. PATENT DOCUMENTS

| 5,528,537 | A  | * | 6/1996  | Lee et al. ................. 365/185.11 |
| 5,805,498 | A  | * | 9/1998  | Lee et al. ................. 365/185.17 |
| 6,028,788 | A  |   | 2/2000  | Choi et al. |
| 6,049,494 | A  | * | 4/2000  | Sakui et al. ................... 365/203 |
| 6,650,567 | B1 | * | 11/2003 | Cho et al. ................. 365/185.17 |
| 7,440,328 | B2 | * | 10/2008 | Liao et al. ................ 365/185.18 |
| 7,616,491 | B2 |   | 11/2009 | Kamigaichi et al. |
| 7,804,712 | B2 | * | 9/2010  | Kim et al. ................. 365/185.03 |
| 8,634,251 | B2 | * | 1/2014  | Chung ..................... 365/185.25 |
| 2013/0003453 | A1 | * | 1/2013 | Park ........................... 365/185.2 |
| 2013/0250678 | A1 | * | 9/2013 | Joo et al. ................. 365/185.03 |

FOREIGN PATENT DOCUMENTS

JP     2000-228097        8/2000
KR     1020100097397 A    9/2010

* cited by examiner

*Primary Examiner* — Huan Hoang
*Assistant Examiner* — Minh Dinh
(74) *Attorney, Agent, or Firm* — Volentine & Whitt, PLLC

(57) ABSTRACT

In method of programming a nonvolatile memory device including first and second cell strings that are coupled to one bitline, a first channel of the first cell string and a second channel of the second cell string are precharged by applying a first voltage to the bitline, one cell string is selected from the first and second cell strings, and a memory cell included in the selected cell string is programmed by applying a second voltage greater than a ground voltage and less than the first voltage to the bitline.

14 Claims, 12 Drawing Sheets

(EVEN PAGE PROGRAM)

(EVEN PAGE PROGRAM)

METHOD OF PROGRAMMING A NONVOLATILE MEMORY DEVICE

CROSS-REFERENCE TO RELATED APPLICATIONS

This U.S. non-provisional application claims the benefit of priority under 35 U.S.C. §119 to Korean Patent Application No. 2012-0032108 filed on Mar. 29, 2012 in the Korean Intellectual Property Office (KIPO), the entire content of which is incorporated by reference herein in its entirety.

BACKGROUND

1. Technical Field

Example embodiments relate to nonvolatile memory devices. More particularly, example embodiments relate to methods of programming nonvolatile memory devices having shared bitline structures.

2. Description of the Related Art

A nonvolatile memory device having a shared bitline structure includes at least two cell strings per bitline. The nonvolatile memory device having the shared bitline structure performs a programming operation such that one cell string is selected from the at least two cell strings coupled to the same bitline and a memory cell included in the selected cell string is programmed. During the programming operation, an unselected cell string is disconnected from the bitline, and thus a channel of the unselected cell string may not be charged through the bitline. Accordingly, a voltage of the channel of the unselected cell string may not be sufficiently boosted, which results in a programming disturbance that undesirably programs a memory cell included in the unselected cell string by a programming voltage applied to a selected wordline.

SUMMARY

Some example embodiments provide a method of programming a nonvolatile memory device preventing a programming disturbance for a memory cell included in an unselected cell string.

According to example embodiments, in a method of programming a nonvolatile memory device including first and second cell strings that are coupled to one bitline, a first channel of the first cell string and a second channel of the second cell string are precharged by applying a first voltage to the bitline, one cell string is selected from the first and second cell strings, and a memory cell included in the selected cell string is programmed by applying a second voltage greater than a ground voltage and less than the first voltage to the bitline.

In some example embodiments, the first voltage may be a power supply voltage, and the second voltage may be greater than the ground voltage and less than the power supply voltage.

In some example embodiments, the first channel of the first cell string and the second channel of the second cell string may be precharged to a first voltage level. When the memory cell included in the selected cell string is programmed, a voltage of a channel of the selected cell string may decrease to a second voltage level that is less than the first voltage level, and a voltage of a channel of an unselected cell string may increase to a third voltage level greater than the first voltage level.

In some example embodiments, the first cell string may include a first string select transistor of an enhancement mode type coupled to a first string select line, a second string select transistor of a depletion mode type coupled to a second string select line, and a plurality of first memory cells respectively coupled to a plurality of wordlines, and the second cell string may include a third string select transistor of the depletion mode type coupled to the first string select line, a fourth string select transistor of the enhancement mode type coupled to the second string select line, and a plurality of second memory cells respectively coupled to the plurality of wordlines.

In some example embodiments, to precharge the first channel of the first cell string and the second channel of the second cell string, a power supply voltage may be applied as the first voltage to the bitline, the first string select transistor and the third string select transistor may be turned on by applying the power supply voltage to the first string select line, and the second string select transistor and the fourth string select transistor may be turned on by applying the power supply voltage to the second string select line.

In some example embodiments, to select the one cell string from the first and second cell strings, the first string select transistor and the second string select transistor may be turned on by applying a power supply voltage to the first string select line and the ground voltage to the second string select line if one of the first memory cells included in the first cell string is to be programmed, and the third string select transistor and the fourth string select transistor may be turned on by applying the ground voltage to the first string select line and the power supply voltage to the second string select line if one of the second memory cells included in the second cell string is to be programmed.

In some example embodiments, the nonvolatile memory device may further include third and fourth cell strings that are coupled to another bitline adjacent to the bitline coupled to the first and second cell strings. The third cell string may include a fifth string select transistor of the enhancement mode type coupled to the first string select line, a sixth string select transistor of the depletion mode type coupled to the second string select line, and a plurality of third memory cells respectively coupled to the plurality of wordlines, and the fourth cell string may include a seventh string select transistor of the depletion mode type coupled to the first string select line, an eighth string select transistor of the enhancement mode type coupled to the second string select line, and a plurality of fourth memory cells respectively coupled to the plurality of wordlines.

In some example embodiments, the nonvolatile memory device may further include third and fourth cell strings that are coupled to another bitline adjacent to the bitline coupled to the first and second cell strings. The third cell string may include a fifth string select transistor of the depletion mode type coupled to the first string select line, a sixth string select transistor of the enhancement mode type coupled to the second string select line, and a plurality of third memory cells respectively coupled to the plurality of wordlines, and the fourth cell string may include a seventh string select transistor of the enhancement mode type coupled to the first string select line, an eighth string select transistor of the depletion mode type coupled to the second string select line, and a plurality of fourth memory cells respectively coupled to the plurality of wordlines.

In some example embodiments, to program the memory cell included in the selected cell string, a voltage greater than the ground voltage and less than a power supply voltage may be applied as the second voltage to the bitline, a pass voltage may be applied to unselected wordlines that are not coupled to the memory cell among a plurality of wordlines, and a programming voltage may be applied to a selected wordline that is coupled to the memory cell among the plurality of wordlines.

According to example embodiments, in a method of programming a nonvolatile memory device including first and second cell strings that are coupled to a first bitline, a first string select line and a second string select line, a first channel of the first cell string and a second channel of the second cell string are precharged by applying a power supply voltage to the first bitline, the first string select line and the second string select line, one cell string is selected from the first and second cell strings by applying the power supply voltage one of the first string select line and the second string select line and by applying a ground voltage to the other one of the first string select line and the second string select line, and a memory cell included in the selected cell string is programmed by applying a voltage greater than the ground voltage and less than the power supply voltage to the first bitline.

In some example embodiments, the first cell string may include a first string select transistor of an enhancement mode type coupled to the first string select line, a second string select transistor of a depletion mode type coupled to the second string select line, and a plurality of first memory cells respectively coupled to a plurality of wordlines, and the second cell string may include a third string select transistor of the depletion mode type coupled to the first string select line, a fourth string select transistor of the enhancement mode type coupled to the second string select line, and a plurality of second memory cells respectively coupled to the plurality of wordlines.

In some example embodiments, the nonvolatile memory device may further include third and fourth cell strings that are coupled to a second bitline adjacent to the first bitline. The third cell string may include a fifth string select transistor of the enhancement mode type coupled to the first string select line, a sixth string select transistor of the depletion mode type coupled to the second string select line, and a plurality of third memory cells respectively coupled to the plurality of wordlines, and the fourth cell string may include a seventh string select transistor of the depletion mode type coupled to the first string select line, an eighth string select transistor of the enhancement mode type coupled to the second string select line, and a plurality of fourth memory cells respectively coupled to the plurality of wordlines.

In some example embodiments, the first memory cells of the first cell string and the third memory cells of the third cell string may be configured to form odd pages, and the second memory cells of the second cell string and the fourth memory cells of the fourth cell string may be configured to form even pages.

In some example embodiments, the nonvolatile memory device may further include third and fourth cell strings that are coupled to a second bitline adjacent to the first bitline. The third cell string may include a fifth string select transistor of the depletion mode type coupled to the first string select line, a sixth string select transistor of the enhancement mode type coupled to the second string select line, and a plurality of third memory cells respectively coupled to the plurality of wordlines, and the fourth cell string may include a seventh string select transistor of the enhancement mode type coupled to the first string select line, an eighth string select transistor of the depletion mode type coupled to the second string select line, and a plurality of fourth memory cells respectively coupled to the plurality of wordlines.

In some example embodiments, the first memory cells of the first cell string and the fourth memory cells of the fourth cell string may be configured to form odd pages, and the second memory cells of the second cell string and the third memory cells of the third cell string may be configured to form even pages.

According to example embodiments, a method is provided for programming a nonvolatile memory device, where the nonvolatile memory device comprises at least first and second bit lines, first and second memory cell strings that are coupled to the first bit line, third and fourth memory cell strings that are coupled to the second bit line, a first string select line and a second string select line, and a plurality of word lines each coupled to a corresponding one of the memory cells of each of the first, second, third and fourth memory cell strings. The method comprises: selecting one memory cell string among the first and second memory cell strings and also selecting one memory cell string among the third and fourth memory cell strings by applying a power supply voltage to one of the first string select line and the second string select line and by applying a ground voltage to the other one of the first string select line and the second string select line; applying to the first bit line a voltage greater than the ground voltage and less than the power supply voltage; and programming a selected memory cell included in the selected one of the first and second memory cell strings by applying a programming voltage to a selected one of the word lines connected to the selected memory cell, and applying a voltage other than the programming voltage to remaining word lines other than the selected word line.

In some example embodiments, the method may further include applying the power supply voltage to the second bit line while applying to the first bit line the voltage greater than the ground voltage and less than the power supply voltage.

In some example embodiments, the method may further include applying a pass voltage different from the programming voltage to all of the word lines prior to applying the programming voltage to the selected one of the word lines connected to the selected memory cell.

In some example embodiments, the method may further include precharging a first channel of the first memory cell string and a second channel of the second memory cell string by applying the supply voltage to the first bitline In some example embodiments, the method may further include precharging a third channel of the third memory cell string and a fourth channel of the fourth memory cell string by applying the supply voltage to the second bitline.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
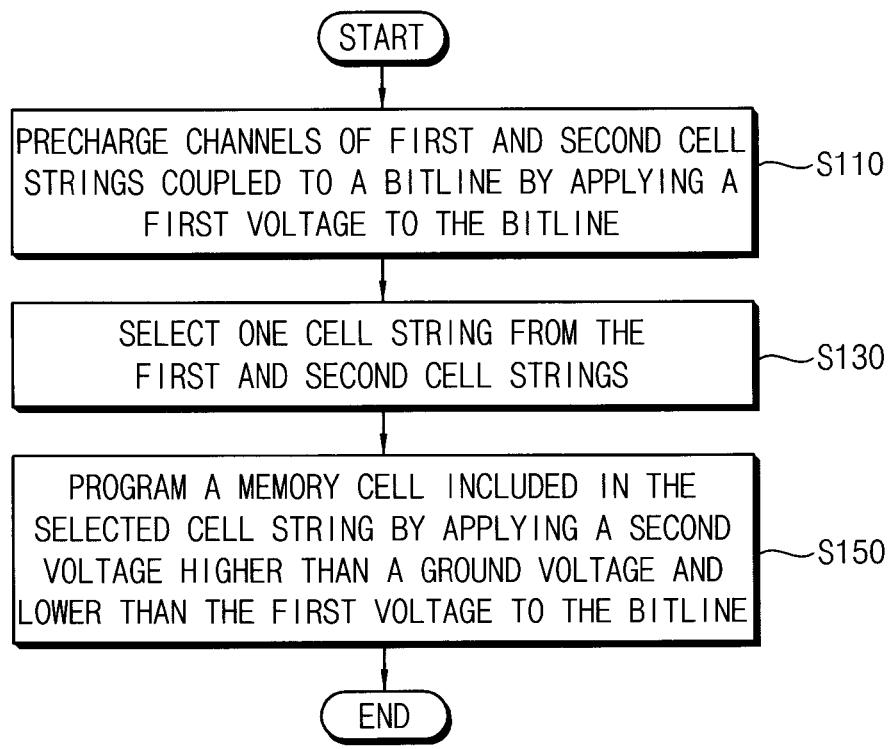
FIG. 1 is a flow chart illustrating a method of programming a nonvolatile memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of programming a nonvolatile memory device according to example embodiments.

Referring to FIG. 1, in a nonvolatile memory device having a shared bitline structure including first and second cell strings coupled to one bitline, a first channel of the first cell string and a second channel of the second cell string are precharged by applying a first voltage to the bitline (S110). In some example embodiments, the first voltage applied to the bitline may be a power supply voltage. For example, the first and second channels of the first and second cell strings may be precharged by turning on all string select transistors included in the first and second cell strings and by applying the power supply voltage as the first voltage to the bitline.

For example, the first cell string may include a first string select transistor of an enhancement mode type coupled to a first string select line, and a second string select transistor of a depletion mode type coupled to a second string select line, and the second cell string may include a third string select transistor of the depletion mode type coupled to the first string select line, and a fourth string select transistor of the enhancement mode type coupled to the second string select line. In this case, the first and third string select transistors may be turned on by applying the power supply voltage to the first string select line, and the second and fourth string select transistors may be turned on by applying the power supply voltage to the second string select line. Thus, if the first voltage (e.g., the power supply voltage) is applied to the bitline, and the power supply voltage is applied to the first and second string select transistors, the first voltage may be applied to the first channel of the first cell string through the turned-on first and second string select transistors and to the second channel of the second cell string through the turned-on third and fourth string select transistors. Accordingly, the first and second channels of the first and second cell strings may be boosted.

One cell string is selected from the first and second cell strings (S130). One of the first and second cell strings may be selected by selectively turning on or off the string select transistors included in the first and second cell strings. For example, in a case where a memory cell included in the first cell string is to be programmed, the first cell string may be selected by turning on the first string select transistor of the enhancement mode type by applying the power supply voltage to the first string select line and by turning off the fourth string select transistor of the enhancement mode type by applying the ground voltage to the second string select line. In this case, since the second string select transistor included in the first cell string is a depletion mode transistor, the second string select transistor may be turned on although the ground voltage is applied to the second string select line. That is, if the power supply voltage and the ground voltage are applied to the first string select line and the second string select line, respectively, the first and second string select transistors are turned on, and the first cell string is selected. Further, in a case where a memory cell included in the second cell string is to be programmed, the second cell string may be selected by turning on the fourth string select transistor of the enhancement mode type by applying the power supply voltage to the second string select line and by turning off the first string select transistor of the enhancement mode type by applying the ground voltage to the first string select line. In some example embodiments, when an odd page programming operation is performed, cell strings including memory cells that form odd pages may be selected. When an even page programming operation is performed, cell strings including memory cells that form even pages may be selected.

A memory cell included in the selected cell string is programmed by applying a second voltage greater than the ground voltage (i.e., a voltage of 0V) and less than the power supply voltage to the bitline (S150). In some example embodiments, the second voltage may be greater than the ground voltage and less than the power supply voltage. For example, the memory cell included in the selected cell string may be programmed by applying a voltage greater than the ground voltage and less than the power supply voltage as the second voltage to the bitline, by applying a pass voltage to unselected wordlines that are not coupled to the memory cell among a plurality of wordlines, and by applying a programming voltage to a selected wordline that is coupled to the memory cell among the plurality of wordlines.

As described above, the first and second channels of the first and second cell strings may be precharged to a first voltage level by the first voltage applied to the bitline. For example, the first voltage level may correspond to a threshold voltage level of a string select transistor of the enhancement mode type subtracted from a voltage level of the first voltage (e.g., the power supply voltage) applied to the bitline. When programming the memory cell included in the selected cell string, a voltage of a channel of the selected cell string may decrease to a second voltage level less than the first voltage level, and a voltage of a channel of an unselected cell string may increase (or may be boosted) to a third voltage level greater than the first voltage level. For example, if the second voltage greater than the ground voltage and less than the first voltage is applied to the bitline, the voltage of the channel of the selected cell string may have the second voltage level substantially the same as a voltage level of the second voltage. Further, the channel of the unselected cell string may be in a floating state, and the voltage of the channel of the unselected cell string may increase to the third voltage level greater than the first voltage level because of coupling with the wordlines to which the pass voltage and the programming voltage are applied.

In some conventional nonvolatile memory devices having a shared bitline structure, a channel of an unselected cell string may not be precharged since the channel of the unselected cell string is electrically disconnected from a bitline. However, in the method of programming the nonvolatile memory device according to example embodiments disclosed herein, channels of all cell strings including unselected cell strings may be precharged. Accordingly, since the voltage of the channel of the unselected cell string is precharged before being boosted by coupling with the wordlines, the voltage of the channel of the unselected cell string may be sufficiently boosted, and a programming disturbance for a memory cell included in the unselected cell string may be prevented.

Further, in some conventional nonvolatile memory devices having the shared bitline structure, the ground voltage is applied to a bitline coupled to a selected cell string. Accordingly, a leakage current may flow from the channel of the unselected cell string to the bitline. However, in the method of programming the nonvolatile memory device according to example embodiments disclosed herein, since the second voltage greater than the ground voltage is applied to the bitline while the memory cell included in the selected cell string is programmed, the leakage current flowing through the channel of the unselected cell string to the bitline may be reduced. Accordingly, the voltage of the channel of the unselected cell string may be sufficiently boosted, and the programming disturbance for the memory cell included in the unselected cell string may be further prevented.

Figure 2:
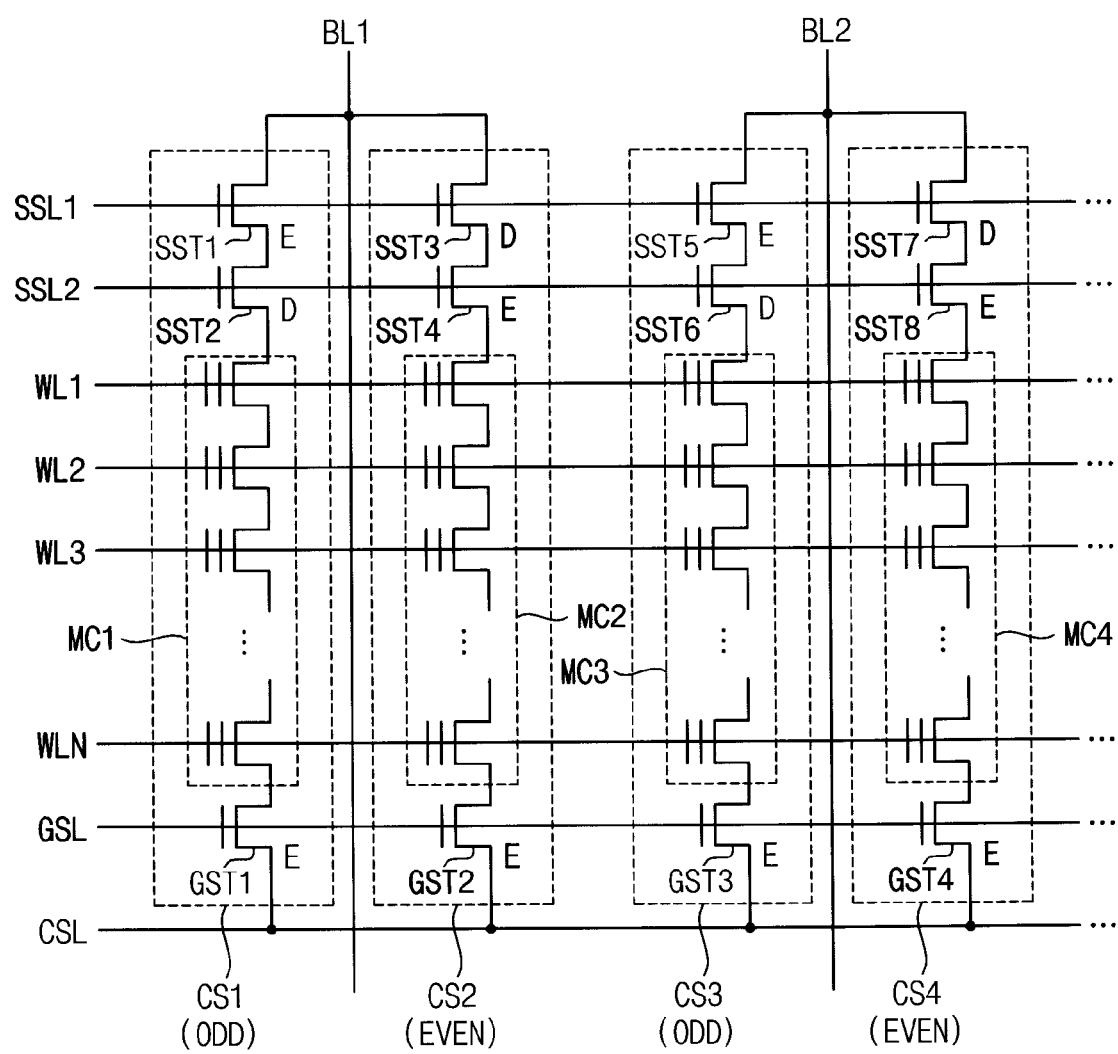
FIG. 2 is a circuit diagram illustrating a memory cell array according to example embodiments.

FIG. 2 is a circuit diagram illustrating a memory cell array according to example embodiments.

Referring to FIG. 2, a memory cell array 200 includes a plurality of bitlines BL1 and BL2, a plurality of cell strings CS1, CS2, CS3 and CS4, a first string select line SSL1, a second string select line SSL2, a plurality of wordlines WL1, WL2, WL3 and WLN, a ground select line GSL and a common source line CSL.

Two or more cell strings CS1, CS2, CS3 and CS4 may be coupled to each bitline BL1 and BL2. For example, a first cell string CS1 and a second cell string CS2 may be coupled to a first bitline BL1, and a third cell string CS3 and a fourth cell string CS4 may be coupled to a second bitline BL2.

The first cell string CS1 may include a first string select transistor SST1 coupled to the first string select line SSL1, a second string select transistor SST2 coupled to the second string select line SSL2, and a plurality of first memory cells MC1 respectively coupled to the plurality of wordlines WL1, WL2, WL3 and WLN. The first and second string select transistors SST1 and SST2 may control an electrical connection between the first bitline BL1 and the first memory cells MC1 in response to voltages of the first and second string select lines SSL1 and SSL2. The first string select transistor SST1 may be an enhancement mode type transistor having a positive threshold voltage, and the second string select transistor SST2 may be a depletion mode transistor having a negative threshold voltage. Thus, the second string select transistor SST2 may be turned on even when a voltage of about 0V is applied to the second string select line SSL2. The first cell string CS1 may further include a first ground select transistor GST1 that controls an electrical connection between the first memory cells MC1 and the common source line CSL in response to a voltage of the ground select line GSL.

The second cell string CS2 may include a third string select transistor SST3 of a depletion mode type coupled to the first string select line SSL1, a fourth string select transistor SST4 of an enhancement mode type coupled to the second string select line SSL2, a plurality of second memory cells MC2 respectively coupled to the plurality of wordlines WL1, WL2, WL3 and WLN, and a second ground select transistor GST2 of the enhancement mode type coupled to the ground select line GSL. The third cell string CS3 may include a fifth string select transistor SST5 of the enhancement mode type coupled to the first string select line SSL1, a sixth string select transistor SST6 of the depletion mode type coupled to the second string select line SSL2, a plurality of third memory cells MC3 respectively coupled to the plurality of wordlines WL1, WL2, WL3 and WLN, and a third ground select transistor GST3 of the enhancement mode type coupled to the ground select line GSL. The fourth cell string CS4 may include a seventh string select transistor SST7 of the depletion mode type coupled to the first string select line SSL1, an eighth string select transistor SST8 of the enhancement mode type coupled to the second string select line SSL2, a plurality of fourth memory cells MC4 respectively coupled to the plurality of wordlines WL1, WL2, WL3 and WLN, and a fourth ground select transistor GST4 of the enhancement mode type coupled to the ground select line GSL.

According to example embodiments, each memory cell MC1, MC2, MC3 and MC4 may be a single level cell (SLC) that stores data of one bit per memory cell, or may be a multi-level cell (MLC) that stores data of two or more bits per memory cell.

In some example embodiments, the first memory cells MC1 of the first cell string CS1 and the third memory cells MC3 of the third cell string CS3 may form odd pages, and the second memory cells MC2 of the second cell string CS2 and the fourth memory cells MC4 of the fourth cell string CS4 may form even pages. That is, each odd page may include memory cells included in odd-numbered cell strings CS1 and CS3 among memory cells coupled to one of the plurality of wordlines WL1, WL2, WL3 and WLN, and each even page may include memory cells included in even-numbered cell strings CS2 and CS4 among the memory cells coupled to one of the plurality of wordlines WL1, WL2, WL3 and WLN.

Hereinafter, a method of programming a nonvolatile memory device including memory cell array 200 according to example embodiments will be described below with reference to FIGS. 3 and 4.

Figure 3:
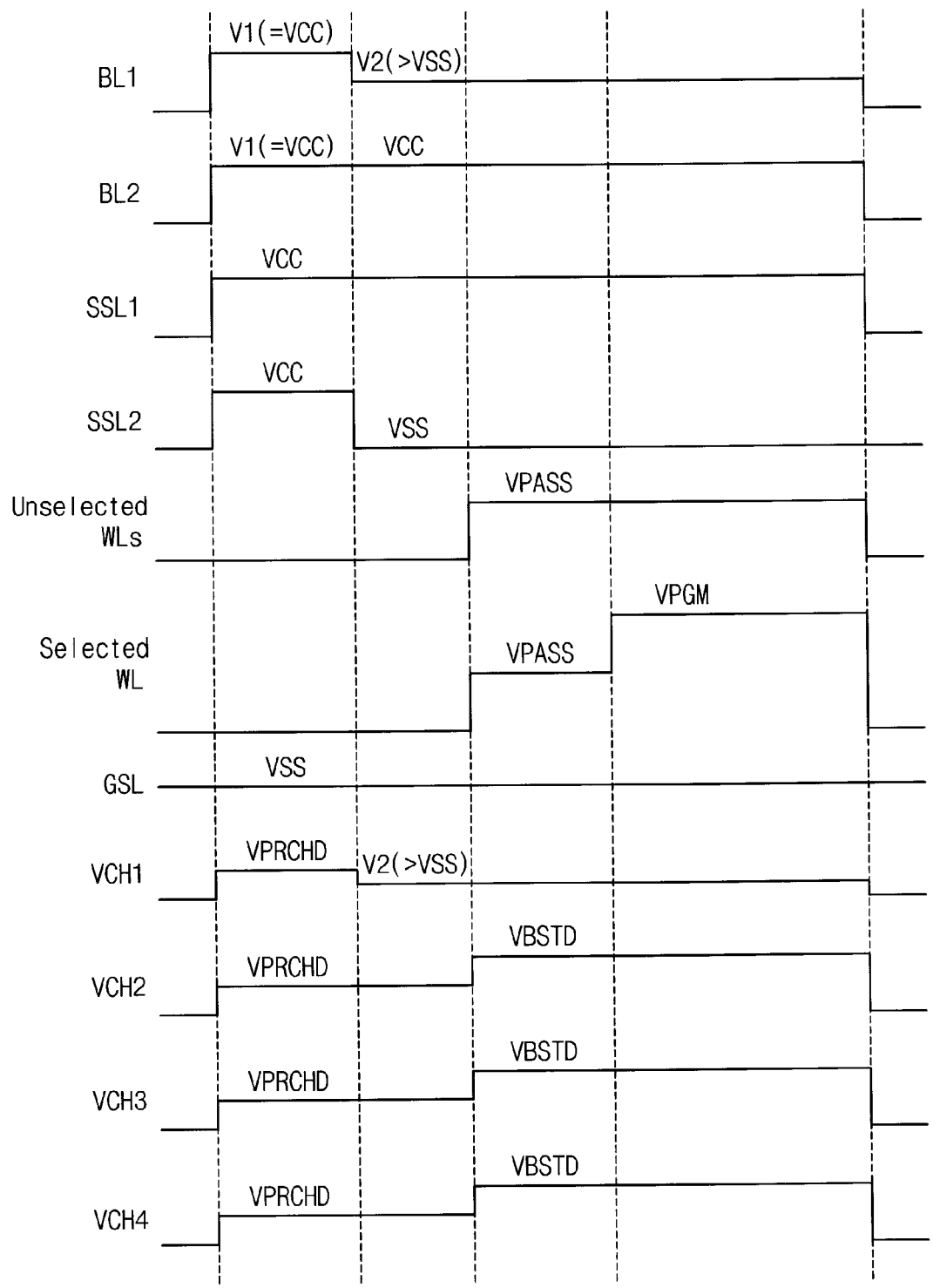
FIG. 3 is a timing diagram for describing an odd page programming operation of a nonvolatile memory device according to example embodiments.

FIG. 3 is a timing diagram for describing an odd page programming operation of a nonvolatile memory device according to example embodiments.

FIG. 3 illustrates an example of a programming operation for an odd page including memory cells of first and third cell strings CS1 and CS3 of FIG. 2 among memory cells coupled to a selected wordline. In the example of FIG. 3, among the memory cells included in the odd page, a memory cell of the first cell string CS1 of FIG. 2 is programmed, and a memory cell of the third cell string CS3 of FIG. 2 is not programmed. For example, the memory cell of the third cell string CS3 may not be programmed since data corresponding to an erase state is to be stored in the memory cell or the memory cell already has a threshold voltage greater than or equal to a verify voltage corresponding to the data to be stored in the memory cell.

Referring to FIGS. 2 and 3, a first voltage V1 may be applied to first and second bitlines BL1 and BL2. In some example embodiments, the first voltage V1 may be a power supply voltage VCC. The power supply voltage VCC may be applied to first and second string select lines SSL1 and SSL2. If the power supply voltage VCC is applied to the first string select line SSL1, not only third and seventh string select transistors SST3 and SST7 of a depletion mode type but also first and fifth string select transistors SST1 and SST5 of an enhancement mode type may be turned on. If the power supply voltage VCC is applied to the second string select line SSL2, not only second and sixth string select transistors SST2 and SST6 of the depletion mode type but also fourth and eighth string select transistors SST4 and SST8 of the enhancement mode type may be turned on. A ground voltage VSS may be applied to a ground select line GSL, and thus first through fourth ground select transistors GST1, GST2, GST3 and GST4 may be turned off.

If the first voltage V1 is applied to the first bitline BL1, and the first and second string select transistors SST1 and SST2 are turned on, a first channel of the first cell string CS1 may be precharged by the first voltage V1 applied through the first bitline BL1. Accordingly, a voltage VCH1 of the first channel of the first cell string CS1 may increase from the ground voltage VSS to a precharged voltage VPRCHD. For example, the precharged voltage VPRCHD may correspond to a threshold voltage of the first string select transistor SST1 of the enhancement mode type subtracted from the first voltage V1 (e.g., the power supply voltage VCC).

If the first voltage V1 is applied to the first bitline BL1, and the third and fourth string select transistors SST3 and SST4 are turned on, a second channel of the second cell string CS2 may be precharged, and a voltage VCH2 of the second channel of the second cell string CS2 may increase from the ground voltage VSS to the precharged voltage VPRCHD. If the first voltage V1 is applied to the second bitline BL2, and the fifth and sixth string select transistors SST5 and SST6 are turned on, a third channel of the third cell string CS3 may be precharged, and a voltage VCH3 of the third channel of the third cell string CS3 may increase from the ground voltage VSS to the precharged voltage VPRCHD. If the first voltage V1 is applied to the second bitline BL2, and the seventh and eighth string select transistors SST7 and SST8 are turned on, a fourth channel of the fourth cell string CS4 may be precharged, and a voltage VCH4 of the fourth channel of the fourth cell string CS4 may increase from the ground voltage VSS to the precharged voltage VPRCHD.

In a conventional nonvolatile memory device having a shared bitline structure, only a selected cell string of a plurality of cell strings coupled to one bitline may be precharged. Thus, a memory cell included in an unselected cell string among memory cells coupled to a selected wordline may be undesirably programmed by a programming voltage applied to the selected wordline. However, in a method of programming a nonvolatile memory device according to example embodiments, not only selected cell strings CS1 and CS3 but also unselected cell strings CS2 and CS4 are precharged, thereby preventing a programming disturbance that undesirably programs a memory cell in an unselected cell string.

After all cell strings CS1, CS2, CS3 and CS4 are precharged, the power supply voltage VCC is applied to the first string select line SSL1 and the ground voltage VSS is applied to the second string select line SSL2 to select first and third cell strings CS1 and CS3 including memory cells that form odd pages. If the power supply voltage VCC and the ground voltage VSS are applied to the first and second string select lines SSL1 and SSL2, respectively, the first, second, fifth and sixth string select transistors SST1, SST2, SST5 and SST6 included in the first and third cell strings CS1 and CS3 may be turned on, and the fourth and eighth string select transistors SST4 and SST8 of the enhancement mode type included in the second and fourth cell strings CS2 and CS4 may be turned off. Since the fourth and eighth string select transistors SST4 and SST8 are turned off, the second and fourth channels of the second and fourth cell strings CS2 and CS4 may be in a floating state. Accordingly, the first and third cell strings CS1 and CS3 may be selected, and the second and fourth cell strings CS2 and CS4 may not be selected.

The power supply voltage VCC or a second voltage V2 may be selectively applied to each bitline BL1 and BL2 according to data to be stored in a memory cell included in the selected cell string CS1 and CS3. For example, in a case where data "0" corresponding to a programmed state is to be stored in a memory cell included in the first cell string CS1, and data "1" corresponding to an erased state is to be stored in a memory cell included in the third cell string CS3, the second voltage V2 may be applied to the first bitline BL1 coupled to the first cell string CS1, and the power supply voltage VCC may be applied to the second bitline BL2 coupled to the third cell string CS3. In other examples, in a case where the memory cell included in the first cell string CS1 has a threshold voltage less than a verify voltage corresponding to data to be stored in the memory cell, and the memory cell included in the third cell string CS3 has a threshold voltage greater than or equal to a verify voltage corresponding to data to be stored in the memory cell, the second voltage V2 may be applied to the first bitline BL1 coupled to the first cell string CS1, and the power supply voltage VCC may be applied to the second bitline BL2 coupled to the third cell string CS3.

If the second voltage V2 is applied to the first bitline BL1, and the power supply voltage VCC is applied to the first string select line SSL1, the first and second string select transistors SST1 and SST2 may be turned on, and the second voltage V2 may be applied to the first channel of the first cell string CS1 through the turned-on first and second string select transistors SST1 and SST2. If the power supply voltage VCC is applied to the second bitline BL2, the power supply voltage VCC may be applied to a drain of the fifth string select transistor SST5, and the precharged voltage VPRCHD may be applied to a source of the fifth string select transistor SST5. Thus, although the power supply voltage VCC is applied to a gate of the fifth string select transistor SST5, the fifth string select transistor SST5 of the enhancement mode type may be cut off. Accordingly, the third channel of the third cell string CS3 coupled to the second bitline BL2 to which the power supply voltage VCC is applied may be in the floating state.

In a conventional nonvolatile memory device having a shared bitline structure, the ground voltage VSS is applied to a bitline coupled to a cell string including a memory cell to be programmed. Accordingly, in the conventional nonvolatile memory device, a leakage current may flow from a channel of an unselected cell string to the bitline. However, in a nonvolatile memory device according to example embodiments disclosed herein, the second voltage V2 greater than the ground voltage VSS may be applied to the bitline coupled to the cell string including the memory cell to be programmed, thereby reducing the leakage current flowing through the channel of the unselected cell string to the bitline. The second voltage V2 that is applied to the first bitline BL1 coupled to the first cell string CS1 including the memory cell to be programmed may be greater than the ground voltage VSS and less than the first voltage V1. In some example embodiments, the second voltage V2 may be greater than the ground voltage VSS and less than the power supply voltage VCC. In other example embodiments, the second voltage V2 may be greater than one tenth of the power supply voltage VCC and less than nine tenths of the power supply voltage VCC. In still other example embodiments, the second voltage V2 may be greater than 0.3 V and less than the power supply voltage VCC minus 0.3 V.

A pass voltage VPASS may be applied to a plurality of wordlines WL1, WL2, WL3 and WLN. If the pass voltage VPASS is applied to the plurality of wordlines WL1, WL2, WL3 and WLN, the second through fourth channels of the second through fourth cell strings CS2, CS3 and CS4 in the floating state may be boosted by coupling with the plurality of wordlines WL1, WL2, WL3 and WLN. Accordingly, voltages VCH2, VCH3 and VCH4 of the second through fourth channels of the second through fourth cell strings CS2, CS3 and CS4 may increase from the precharged voltage VPRCHD to a boosted voltage VBSTD. In a conventional nonvolatile memory device having a shared bitline structure, since a channel of a selected cell string including a memory cell to be programmed has the ground voltage VSS, a channel of an unselected cell string may not be sufficiently boosted due to coupling with a channel of the selected cell string. However, in the nonvolatile memory device according to example embodiments, since a channel of a selected cell string (e.g., the first cell string CS1) including a memory cell to be programmed has the second voltage V2 greater than the ground voltage VSS, a channel of an unselected cell string (e.g., the second cell string CS2) may be less affected by the coupling with the channel of the selected cell string.

After or while the second through fourth channels of the second through fourth cell strings CS2, CS3 and CS4 are boosted, the memory cell included in the first cell string CS1 may be programmed by applying a programming voltage VPGM to the selected wordline. In the method of programming the nonvolatile memory device according to example embodiments disclosed herein, since not only the third channel of the third cell string CS3 that is a selected cell string but also the second and fourth channels of the second and fourth cell strings CS2 and CS4 that are unselected cell strings are precharged, the voltages VCH2, VCH3 and VCH4 of the second through fourth channels of the second through fourth cell strings CS2, CS3 and CS4 may be sufficiently boosted. Further, since the second voltage V2 greater than the ground voltage VSS is applied to the first bitline BL1 coupled to the first cell string CS1 including the memory cell to be programmed, the leakage current of the unselected second cell string CS2 coupled to the first bitline BL1 may be reduced, and the voltage VCH2 of the second channel of the second cell string CS2 may not be decreased by the leakage current. In addition, since the first channel of the first cell string CS1 has the second voltage V2 greater than the ground voltage VSS, the voltage VCH2 of the second channel of the second cell string CS2 may be affected less by the coupling with the first channel of the first cell string CS1 than in a conventional device where the first channel of the first cell string CS1 is at the ground voltage VSS.

Although FIG. 3 illustrates an example where the power supply voltage VCC is applied to the first and second string select lines SSL1 and SSL2 at the same time when the first voltage V1 is applied to the first and second bitlines BL1 and BL2, in some example embodiments, a time point when the power supply voltage VCC starts to be applied to the first and second string select lines SSL1 and SSL2 may be different from a time point when the first voltage V1 starts to be applied to the first and second bitlines BL1 and BL2. For example, after the first voltage V1 starts to be applied to the first and second bitlines BL1 and BL2, the power supply voltage VCC may start to be applied to the first and second string select lines SSL1 and SSL2. In the case where the time points are different from each other, a time period during which the first and second bitlines BL1 and BL2 have the first voltage V1 and the first and second string select lines SSL1 and SSL2 have the power supply voltage may be sufficiently long to precharge the first through fourth channels of the first through fourth cell strings CS1, CS2, CS3 and CS4. Further, although FIG. 3 illustrates an example where the ground voltage VSS is applied to the second string select line SSL2 at the same time when the second voltage V2 is applied to the first bitline BL1, in some example embodiments, a time point when the ground voltage VSS starts to be applied to the second string select line SSL2 may be different from a time point when the second voltage V2 starts to be applied to the first bitline BL1.

Although FIG. 3 illustrates an example where the pass voltage VPASS is applied to the plurality of wordlines WL1, WL2, WL3 and WLN after the second voltage V2 is applied to the first bitline BL1 and the ground voltage VSS is applied to the second string select line SSL2, in some example embodiments, the pass voltage VPASS may be applied to the plurality of wordlines WL1, WL2, WL3 and WLN before the second voltage V2 is applied to the first bitline BL1 and the ground voltage VSS is applied to the second string select line SSL2, or while the first and second bitlines BL1 and BL2 have the first voltage V1 and the first and second string select lines SSL1 and SSL2 have the power supply voltage VCC.

Figure 4:
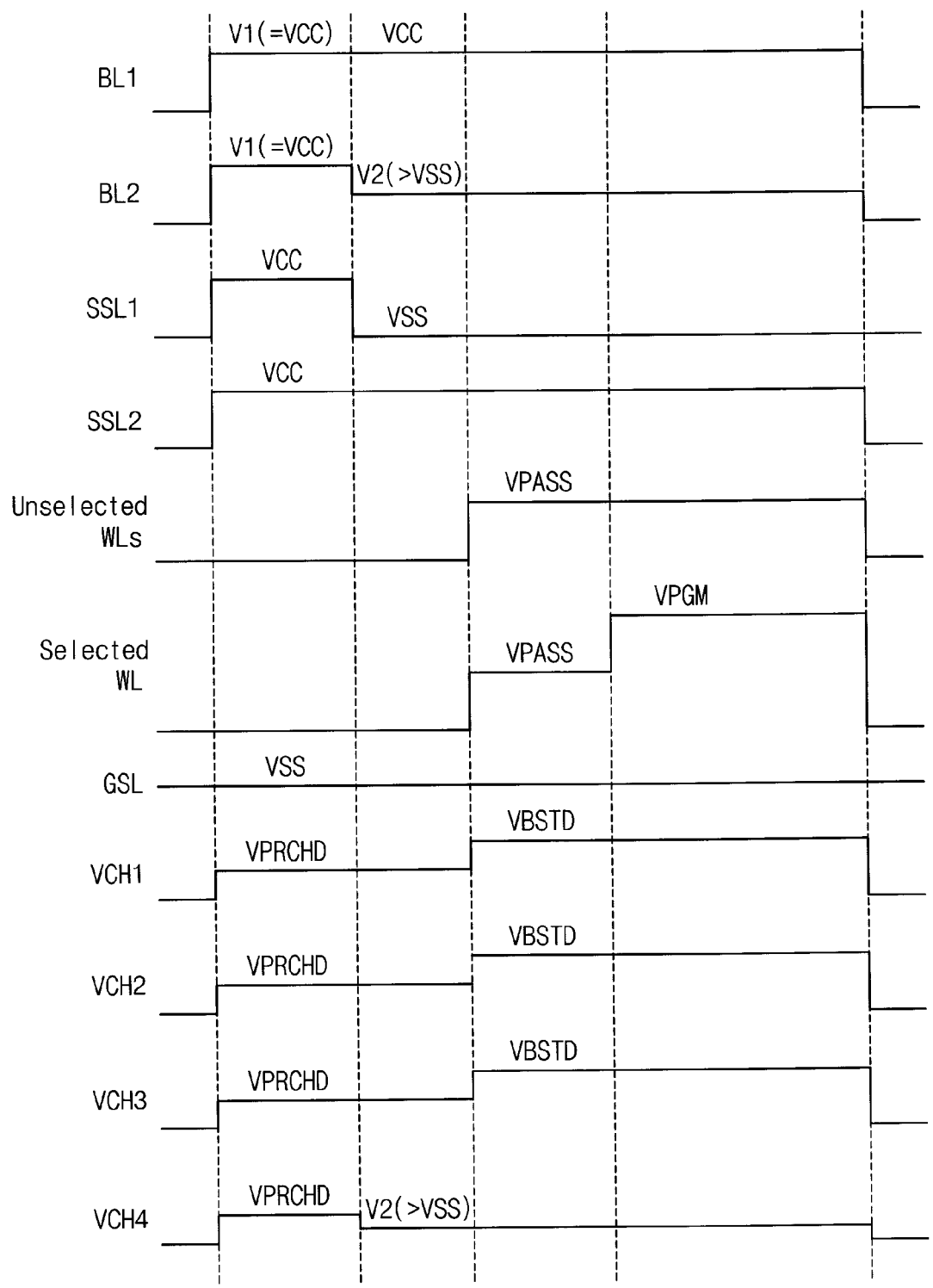
FIG. 4 is a timing diagram for describing an even page programming operation of a nonvolatile memory device according to example embodiments.

FIG. 4 is a timing diagram for describing an even page programming operation of a nonvolatile memory device according to example embodiments.

FIG. 4 illustrates an example of a programming operation for an even page including memory cells of second and fourth cell strings CS2 and CS4 of FIG. 2 among memory cells coupled to a selected wordline. In the example of FIG. 4, among the memory cells included in the even page, a memory cell of the second cell string CS2 of FIG. 2 is not programmed, and a memory cell of the fourth cell string CS4 of FIG. 2 is programmed. For example, the memory cell of the second cell string CS2 may not be programmed since data corresponding to an erased state is to be stored in the memory cell or the memory cell already has a threshold voltage greater than or equal to a verify voltage corresponding to the data to be stored in the memory cell.

Referring to FIGS. 2 and 4, a first voltage V1 (e.g., a power supply voltage VCC) may be applied to first and second bitlines BL1 and BL2, and the power supply voltage VCC may be applied to first and second string select lines SSL1 and SSL2. Accordingly, first through eighth string select transistors SST1, SST2, SST3, SST4, SST5, SST6, SST7 and SST8 may be turned on, and first through fourth channels of first through fourth cell strings CS1, CS2, CS3 and CS4 may be precharged by the first voltage V1 applied to the first and second bitlines BL1 and BL2. For example, voltages VCH1, VCH2, VCH3 and VCH4 of the first through fourth channels of the first through fourth cell strings CS1, CS2, CS3 and CS4 may increase from a ground voltage VSS to a precharged voltage VPRCHD.

To perform an even page programming operation, the ground voltage VSS may be applied to the first string select line SSL1, and the power supply voltage VCC may be applied to the second string select line SSL2. Thus, the first and fifth string select transistors SST1 and SST5 of an enhancement mode type included in the first and third cell strings CS1 and CS3 may be turned off, and the fourth and eighth string select transistors SST4 and SST8 of the enhancement mode type included in the second and fourth cell strings CS2 and CS4 may be turned on. Accordingly, the first and third cell strings CS1 and CS3 may not be selected, and the second and fourth cell strings CS2 and CS4 may be selected. Further, the power supply voltage VCC may be applied to the first bitline BL1 so as not to program a memory cell included in the second cell string CS2, and a second voltage V2 greater than the ground voltage VSS and less than the first voltage V1 may be applied to the second bitline BL2 so as to program a memory cell included in the fourth cell string CS4. Accordingly, the fourth channel of the fourth cell string CS4 may have the second voltage V2 through the second bitline BL2, and the first through third channels of the first and third cell strings CS1, CS2 and CS3 may be in a floating state.

If a pass voltage VPASS is applied to a plurality of wordlines WL1, WL2, WL3 and WLN, the first through third channels of the first through third cell strings CS1, CS2 and CS3 in the floating state may be boosted by coupling with the plurality of wordlines WL1, WL2, WL3 and WLN. Accordingly, the voltages VCH1, VCH2 and VCH3 of the first through third channels of the first through third cell strings CS1, CS2 and CS3 may increase from the precharged voltage VPRCHD to a boosted voltage VBSTD. After the first through third channels of the first through third cell strings CS1, CS2 and CS3 are boosted, the memory cell included in the fourth cell string CS4 may be programmed by applying a programming voltage VPGM to the selected wordline.

As described above, in a method of programming a nonvolatile memory device according to example embodiments as disclosed herein, since not only the second channel of the second cell string CS2 that is a selected cell string but also the first and third channels of the first and third cell strings CS1 and CS3 that are unselected cell strings are precharged, the voltages VCH1, VCH2 and VCH3 of the first through third channels of the first through third cell strings CS1, CS2 and CS3 may be sufficiently boosted. Further, since the second voltage V2 greater than the ground voltage VSS is applied to the second bitline BL2 coupled to the fourth cell string CS4 including the memory cell to be programmed, the leakage current of the unselected third cell string CS3 coupled to the second bitline BL2 may be reduced, and the voltage VCH3 of the third channel of the third cell string CS3 may not be decreased by the leakage current. In addition, since the fourth channel of the fourth cell string CS4 has the second voltage V2 greater than the ground voltage VSS, the voltage VCH3 of the third channel of the third cell string CS3 may be less affected by the coupling with the fourth channel of the fourth cell string CS4.

Figure 5:
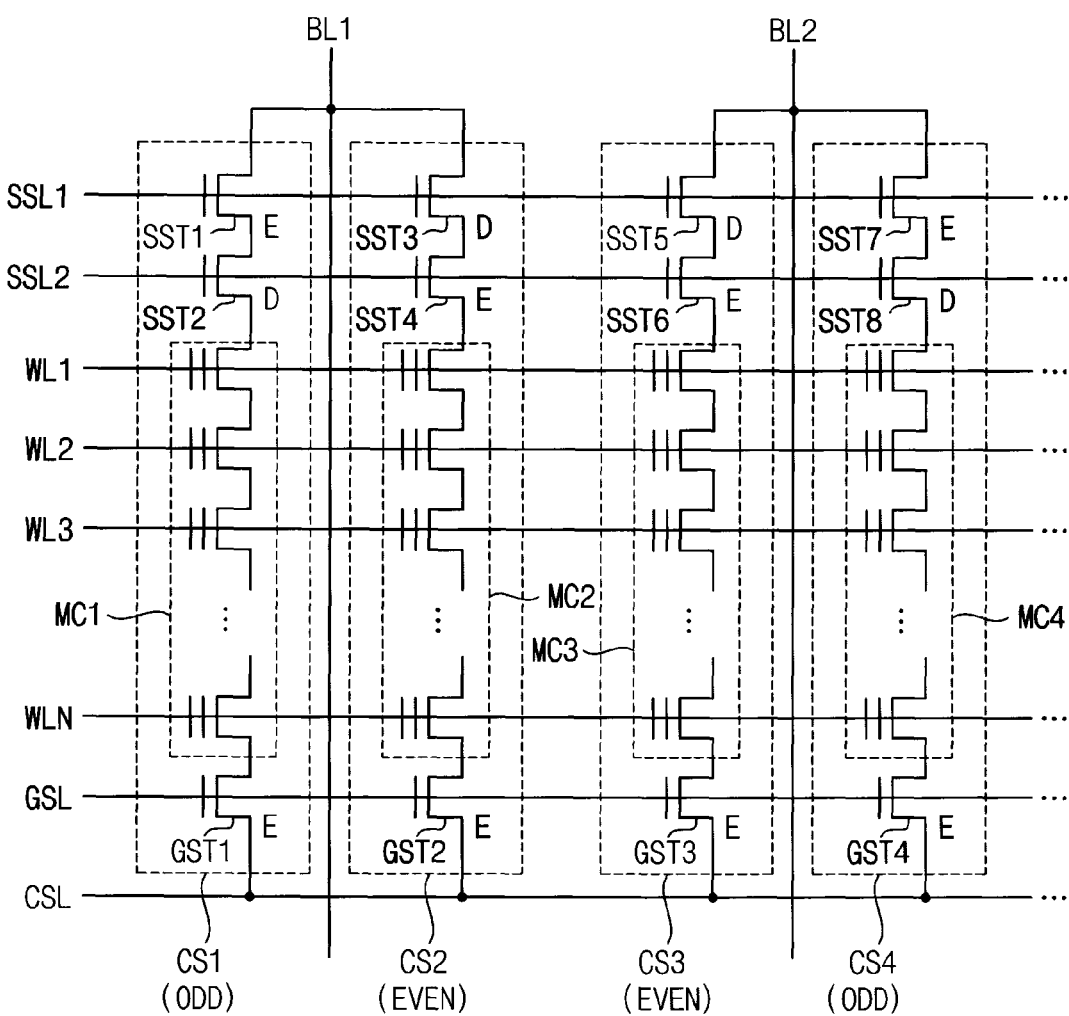
FIG. 5 is a circuit diagram illustrating a memory cell array according to example embodiments.

FIG. 5 is a circuit diagram illustrating a memory cell array according to example embodiments.

Referring to FIG. 5, a memory cell array 300 includes a plurality of bitlines BL1 and BL2, a plurality of cell strings CS1, CS2, CS3 and CS4, a first string select line SSL1, a second string select line SSL2, a plurality of wordlines WL1, WL2, WL3 and WLN, a ground select line GSL and a common source line CSL. Memory cell array 300 of FIG. 5 may have a similar configuration to memory cell array 200 of FIG. 2, except for modes or types of fifth through eighth string select transistors SST5, SST6, SST7 and SST8 which are employed.

Two or more cell strings CS1, CS2, CS3 and CS4 may be coupled to each bitline BL1 and BL2. For example, a first cell string CS1 and a second cell string CS2 may be coupled to a first bitline BL1, and a third cell string CS3 and a fourth cell string CS4 may be coupled to a second bitline BL2.

The first cell string CS1 may include a first string select transistor SST1 of an enhancement mode type coupled to the first string select line SSL1 and a second string select transistor SST2 of a depletion mode type coupled to the second string select line SSL2, the second cell string CS2 may include a third string select transistor SST3 of the depletion mode type coupled to the first string select line SSL1 and a fourth string select transistor SST4 of the enhancement mode type coupled to the second string select line SSL2, the third cell string CS3 may include a fifth string select transistor SST5 of the depletion mode type coupled to the first string select line SSL1 and a sixth string select transistor SST6 of the enhancement mode type coupled to the second string select line SSL2, and the fourth cell string CS4 may include a seventh string select transistor SST7 of the enhancement mode type coupled to the first string select line SSL1 and an eighth string select transistor SST8 of the depletion mode type coupled to the second string select line SSL2. Accordingly, the first and fourth cell strings CS1 and CS4 may be selected when a power supply voltage is applied to the first string select line SSL1, and the second and third cell strings CS2 and CS3 may be selected when the power supply voltage is applied to the second string select line SSL2.

In some example embodiments, first memory cells MC1 included in the first cell string CS1 and fourth memory cells MC4 included in the fourth cell string CS4 may form odd pages, and second memory cells MC2 included in the second cell string CS2 and third memory cells MC3 included in the third cell string CS3 may form even pages. That is, each odd page may include memory cells included in (4N+1)-th and (4N+4)-th cell strings CS1 and CS4 among memory cells coupled to one of the plurality of wordlines WL1, WL2, WL3 and WLN, and each even page may include memory cells included in (4N+2)-th and (4N+3)-th cell strings CS2 and CS3 among the memory cells coupled to one of the plurality of wordlines WL1, WL2, WL3 and WLN, where N is an integer greater than or equal to 0.

Hereinafter, a method of programming a nonvolatile memory device including memory cell array 300 according to example embodiments will be described below with reference to FIGS. 6 and 7.

Figure 6:
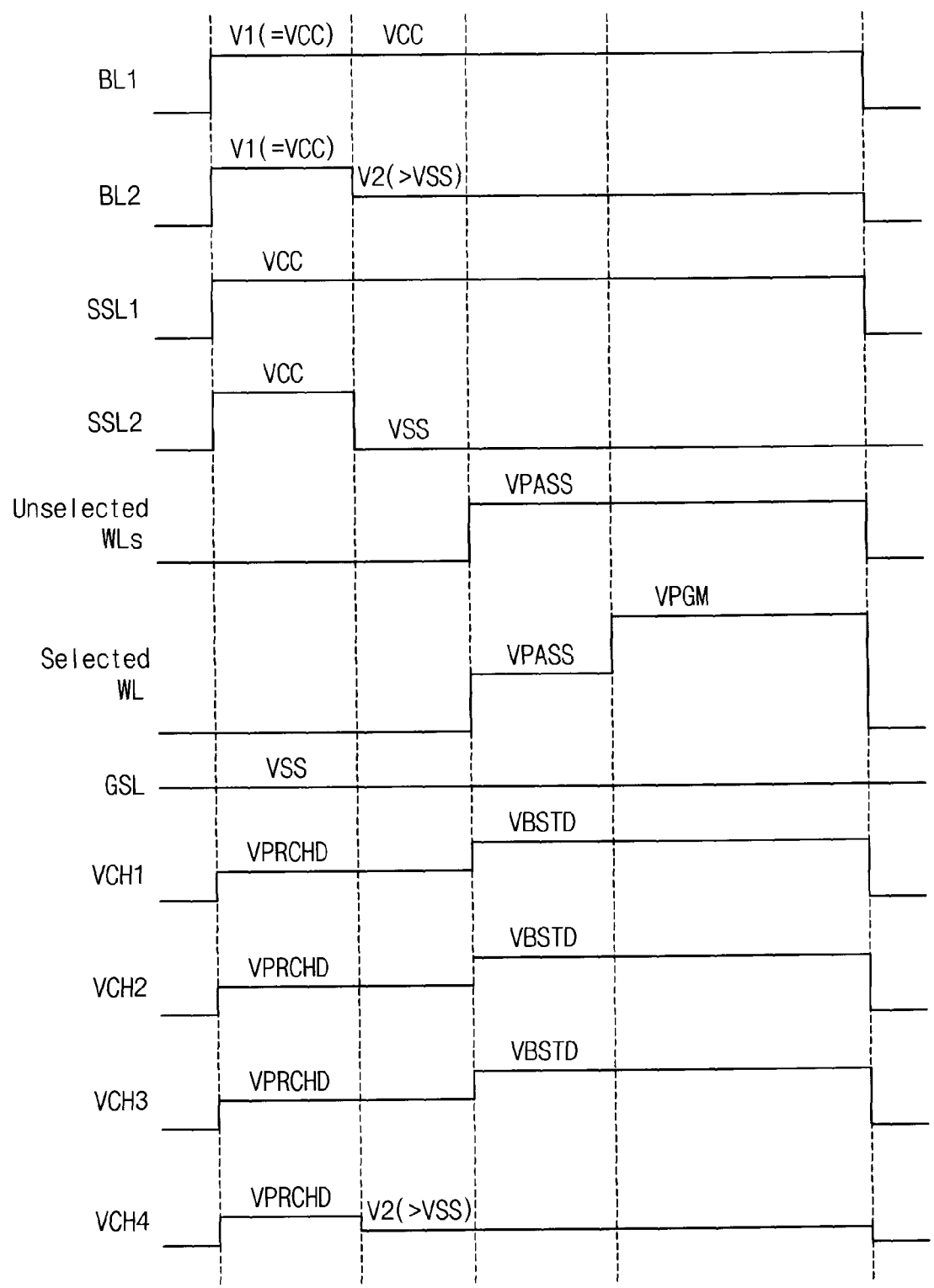
FIG. 6 is a timing diagram for describing an odd page programming operation of a nonvolatile memory device according to example embodiments.

FIG. 6 is a timing diagram for describing an odd page programming operation of a nonvolatile memory device according to example embodiments.

FIG. 6 illustrates an example of a programming operation for an odd page including memory cells of first and fourth cell strings CS1 and CS4 of FIG. 5 among memory cells coupled to a selected wordline. In the example of FIG. 6, among the memory cells included in the odd page, a memory cell of the first cell string CS1 of FIG. 5 is not programmed, and a memory cell of the fourth cell string CS4 of FIG. 5 is programmed. For example, the memory cell of the first cell string CS1 may not be programmed since data corresponding to an erase state is to be stored in the memory cell or the memory cell already has a threshold voltage greater than or equal to a verify voltage corresponding to the data to be stored in the memory cell.

Referring to FIGS. 5 and 6, a first voltage V1 (e.g., a power supply voltage VCC) may be applied to first and second bitlines BL1 and BL2, and the power supply voltage VCC may be applied to first and second string select lines SSL1 and SSL2. Accordingly, first through eighth string select transistors SST1, SST2, SST3, SST4, SST5, SST6, SST7 and SST8 may be turned on, and first through fourth channels of first through fourth cell strings CS1, CS2, CS3 and CS4 may be precharged by the first voltage V1 applied to the first and second bitlines BL1 and BL2. For example, voltages VCH1, VCH2, VCH3 and VCH4 of the first through fourth channels of the first through fourth cell strings CS1, CS2, CS3 and CS4 may increase from a ground voltage VSS to a precharged voltage VPRCHD.

To perform the odd page programming operation, the power supply voltage VCC may be applied to the first string select line SSL1, and the ground voltage VSS may be applied to the second string select line SSL2. Thus, the fourth and sixth string select transistors SST4 and SST6 of an enhancement mode type included in the second and third cell strings CS2 and CS3 may be turned off, and the first and seventh string select transistors SST1 and SST7 of the enhancement mode type included in the first and fourth cell strings CS1 and CS4 may be turned on. Accordingly, the second and third cell strings CS2 and CS3 may not be selected, and the first and fourth cell strings CS1 and CS4 may be selected. Further, the power supply voltage VCC may be applied to the first bitline BL1 not to program a memory cell included in the first cell string CS1, and a second voltage V2 greater than the ground voltage VSS and less than the first voltage V1 may be applied to the second bitline BL2 to program a memory cell included in the fourth cell string CS4. Accordingly, the fourth channel of the fourth cell string CS4 may have the second voltage V2 through the second bitline BL2, and the first through third channels of the first and third cell strings CS1, CS2 and CS3 may be in a floating state.

If a pass voltage VPASS is applied to a plurality of wordlines WL1, WL2, WL3 and WLN, the first through third channels of the first through third cell strings CS1, CS2 and CS3 in the floating state may be boosted by coupling with the plurality of wordlines WL1, WL2, WL3 and WLN. Accordingly, the voltages VCH1, VCH2 and VCH3 of the first through third channels of the first through third cell strings CS1, CS2 and CS3 may increase from the precharged voltage VPRCHD to a boosted voltage VBSTD. After the first through third channels of the first through third cell strings CS1, CS2 and CS3 are boosted, the memory cell included in the fourth cell string CS4 may be programmed by applying a programming voltage VPGM to the selected wordline.

As described above, in a method of programming a nonvolatile memory device according to example embodiments, since not only the first channel of the first cell string CS1 that is a selected cell string but also the second and third channels of the second and third cell strings CS2 and CS3 that are unselected cell strings are precharged, the voltages VCH1, VCH2 and VCH3 of the first through third channels of the first through third cell strings CS1, CS2 and CS3 may be sufficiently boosted. Further, since the second voltage V2 greater than the ground voltage VSS is applied to the second bitline BL2 coupled to the fourth cell string CS4 including the memory cell to be programmed, the leakage current of the unselected third cell string CS3 coupled to the second bitline BL2 may be reduced, and the voltage VCH3 of the third channel of the third cell string CS3 may not be decreased by the leakage current. In addition, since the fourth channel of the fourth cell string CS4 has the second voltage V2 greater than the ground voltage VSS, the voltage VCH3 of the third channel of the third cell string CS3 may be less affected by the coupling with the fourth channel of the fourth cell string CS4.

Figure 7:
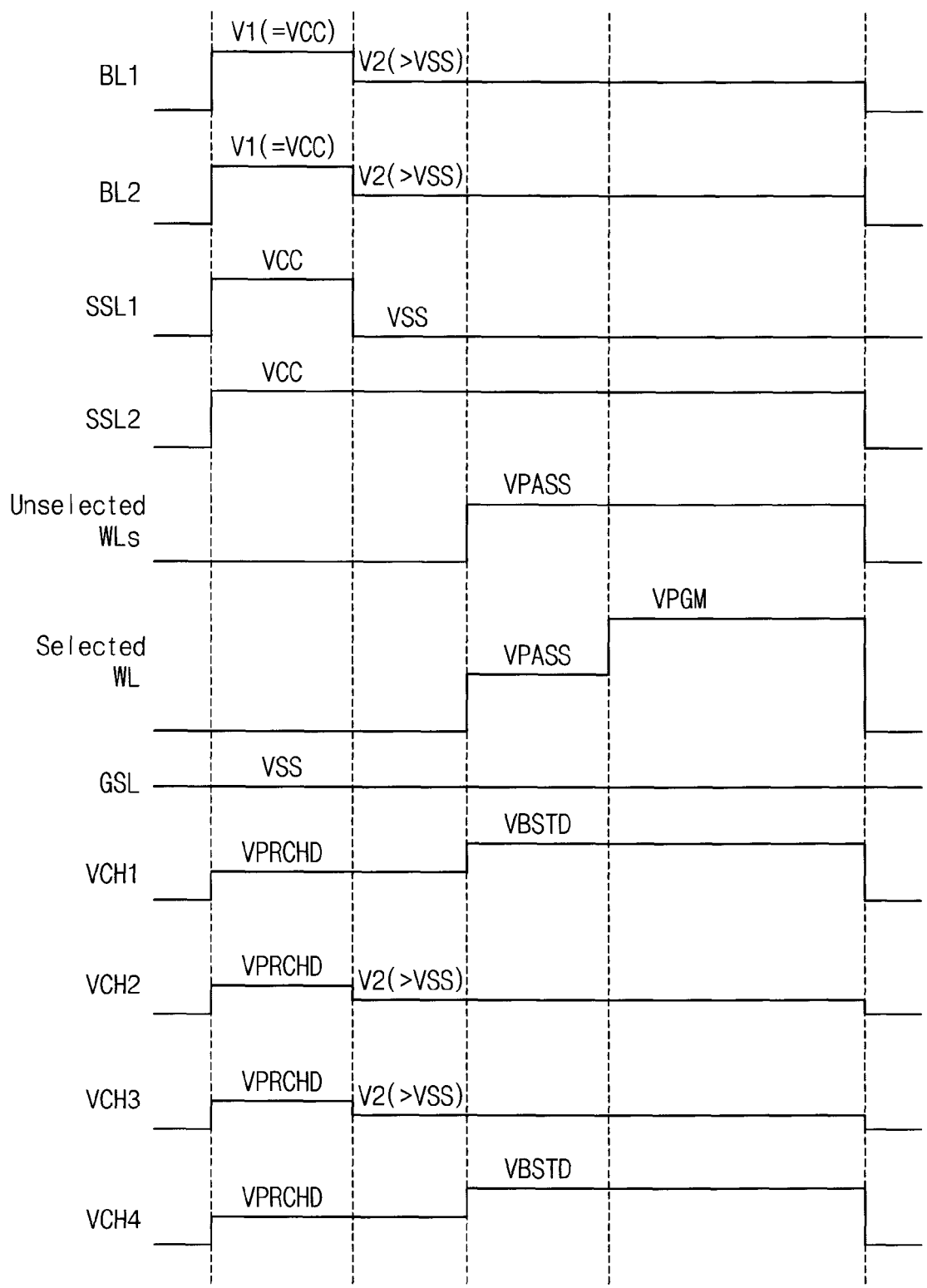
FIG. 7 is a timing diagram for describing an even page programming operation of a nonvolatile memory device according to example embodiments.

FIG. 7 is a timing diagram for describing an even page programming operation of a nonvolatile memory device according to example embodiments.

FIG. 7 illustrates an example of a programming operation for an even page including memory cells of second and third cell strings CS2 and CS3 of FIG. 5 among memory cells coupled to a selected wordline. In the example of FIG. 7, among the memory cells included in the even page, a memory cell of the second cell string CS2 of FIG. 5 and a memory cell of the third cell string CS3 of FIG. 5 are programmed.

Referring to FIGS. 5 and 7, a first voltage V1 (e.g., a power supply voltage VCC) may be applied to first and second bitlines BL1 and BL2, and the power supply voltage VCC may be applied to first and second string select lines SSL1 and SSL2. Accordingly, first through eighth string select transistors SST1, SST2, SST3, SST4, SST5, SST6, SST7 and SST8 may be turned on, and first through fourth channels of first through fourth cell strings CS1, CS2, CS3 and CS4 may be precharged by the first voltage V1 applied to the first and second bitlines BL1 and BL2. For example, voltages VCH1, VCH2, VCH3 and VCH4 of the first through fourth channels of the first through fourth cell strings CS1, CS2, CS3 and CS4 may increase from a ground voltage VSS to a precharged voltage VPRCHD.

To perform the even page programming operation, the ground voltage VSS may be applied to the first string select line SSL1, and the power supply voltage VCC may be applied to the second string select line SSL2. Thus, the first and seventh string select transistors SST1 and SST7 of an enhancement mode type included in the first and fourth cell strings CS1 and CS4 may be turned off, and the fourth and sixth string select transistors SST4 and SST6 of the enhancement mode type included in the second and third cell strings CS2 and CS3 may be turned on. Accordingly, the first and fourth cell strings CS1 and CS4 may not be selected, and the second and third cell strings CS2 and CS3 may be selected. Further, a second voltage V2 greater than the ground voltage VSS and less than the first voltage V1 may be applied to the first and second bitlines BL1 and BL2 to program memory cells included in the second and third cell strings CS2 and CS3. Accordingly, the second and third channels of the second and third cell strings CS2 and CS3 may have the second voltage V2 through the first and second bitlines BL1 and BL2, and the first and fourth channels of the first and fourth cell strings CS1 and CS4 may be in a floating state.

If a pass voltage VPASS is applied to a plurality of wordlines WL1, WL2, WL3 and WLN, the first and fourth channels of the first and fourth cell strings CS1 and CS4 in the floating state may be boosted by coupling with the plurality of wordlines WL1, WL2, WL3 and WLN. Accordingly, the voltages VCH1 and VCH4 of the first and fourth channels of the first and fourth cell strings CS1 and CS4 may increase from the precharged voltage VPRCHD to a boosted voltage VBSTD. After the first and fourth channels of the first and fourth cell strings CS1 and CS4 are boosted, the memory cells included in the second and third cell strings CS2 and CS3 may be programmed by applying a programming voltage VPGM to the selected wordline.

As described above, in a method of programming a nonvolatile memory device according to example embodiments as disclosed herein, since the first and fourth channels of the first and fourth cell strings CS1 and CS4 that are unselected cell strings are precharged, the voltages VCH1 and VCH4 of the first and fourth channels of the first and fourth cell strings CS1 and CS4 may be sufficiently boosted. Further, since the second voltage V2 greater than the ground voltage VSS is applied to the first and second bitlines BL1 and BL2, the leakage current of the unselected first and fourth cell strings CS1 and CS4 may be reduced, and the voltages VCH1 and VCH4 of the first and fourth channels of the first and fourth cell strings CS1 and CS4 may not be decreased by the leakage current. In addition, since the second and third channels of the second and third cell strings CS2 and CS3 have the second voltage V2 greater than the ground voltage VSS, the voltages VCH1 and VCH4 of the first and fourth channels of the first and fourth cell strings CS1 and CS4 may be less affected by the coupling with the second and third channels of the second and third cell strings CS2 and CS3.

Figure 8:
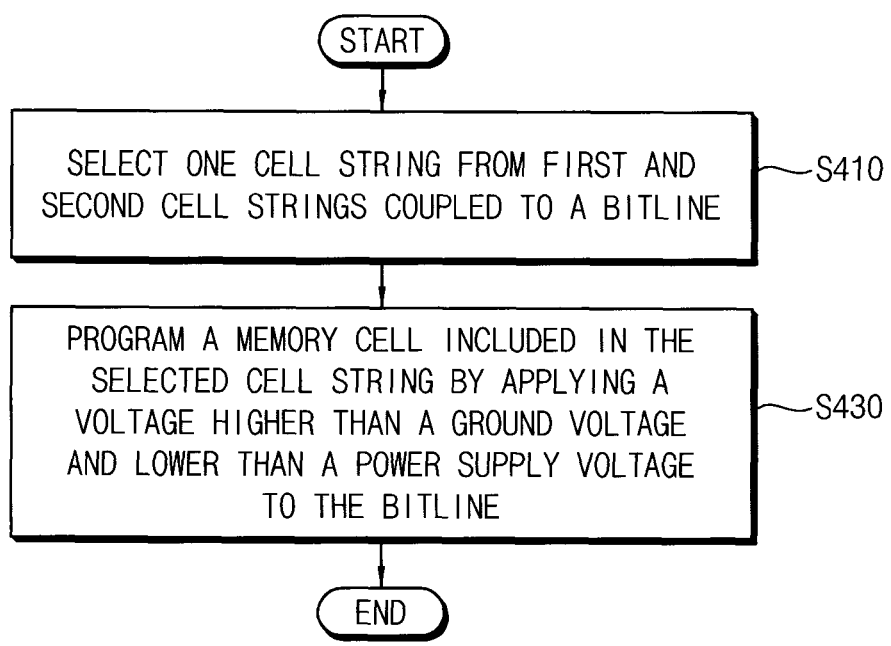
FIG. 8 is a flow chart illustrating a method of programming a nonvolatile memory device according to example embodiments.

FIG. 8 is a flow chart illustrating a method of programming a nonvolatile memory device according to example embodiments. Unlike a programming method illustrated in FIG. 1, the programming method illustrated in FIG. 8 may not perform a precharge operation for all cell strings.

Referring to FIG. 8, in a nonvolatile memory device having a shared bitline structure including first and second cell strings coupled to one bitline, one cell string is selected from the first and second cell strings (S410). One of the first and second cell strings may be selected by selectively turning on or off string select transistors included in the first and second cell strings. In some example embodiments, cell strings including memory cells that form odd pages may be selected when an odd page programming operation is performed, and cell strings including memory cells that form even pages may be selected when an even page programming operation is performed.

A memory cell included in the selected cell string is programmed by applying a voltage greater than the ground voltage (i.e., a voltage of 0V) and less than the power supply voltage to the bitline (S150). For example, the memory cell included in the selected cell string may be programmed by applying a voltage greater than the ground voltage and less than the power supply voltage to the bitline, by applying a pass voltage to unselected wordlines that are not coupled to the memory cell among a plurality of wordlines, and by applying a programming voltage to a selected wordline that is coupled to the memory cell among the plurality of wordlines.

As described above, in a method of programming a nonvolatile memory device according to example embodiments, the voltage greater than the ground voltage and less than the first voltage may be applied to the bitline while the memory cell included in the selected cell string is programmed, and thus a leakage current flowing through a channel of an unselected cell string to the bitline may be reduced. Accordingly, the voltage of the channel of the unselected cell string may be sufficiently boosted, and the programming disturbance for the memory cell included in the unselected cell string may be prevented.

Figure 9:
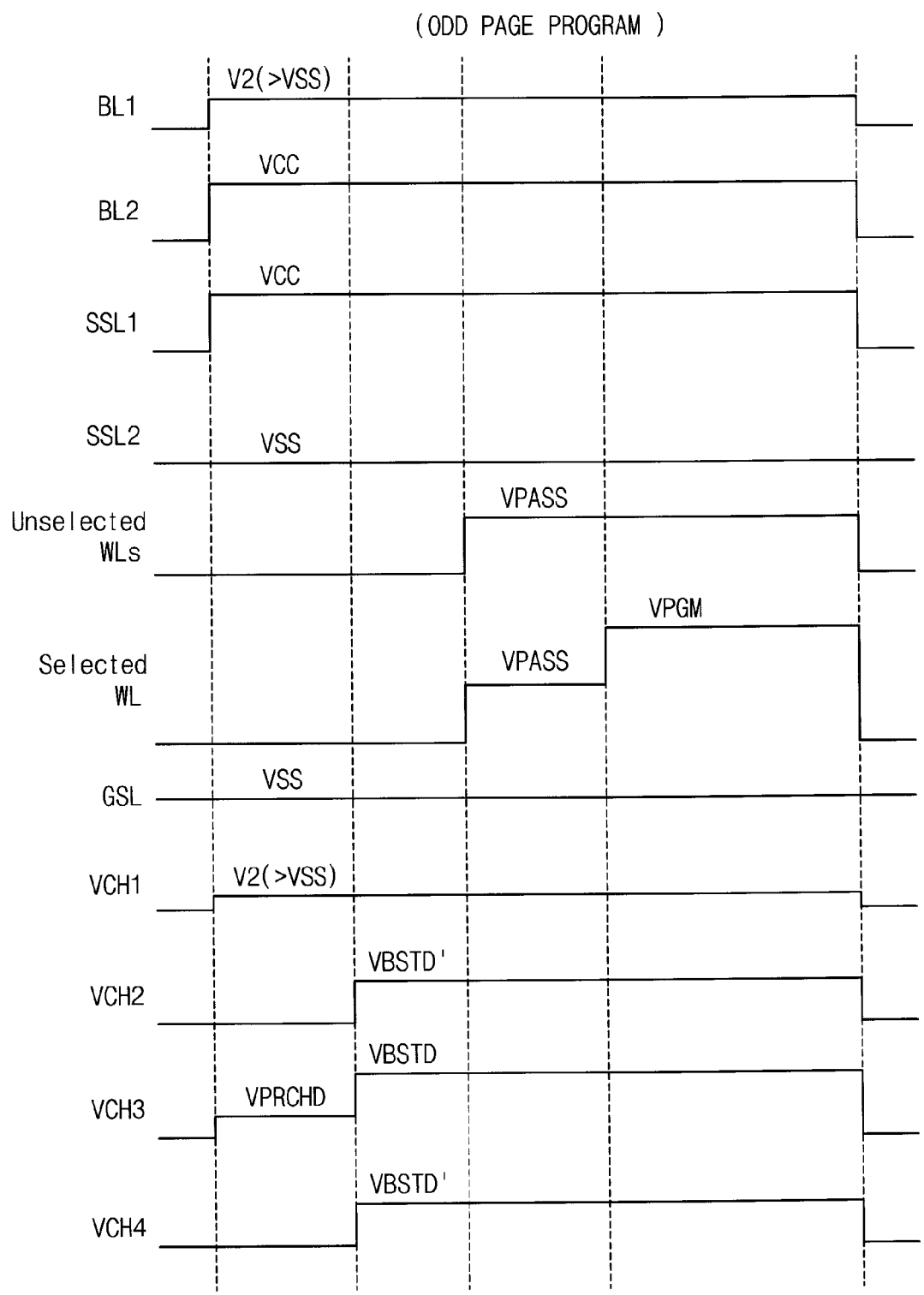
FIG. 9 is a timing diagram for describing an odd page programming operation of a nonvolatile memory device according to example embodiments.

FIG. 9 is a timing diagram for describing an odd page programming operation of a nonvolatile memory device according to example embodiments.

FIG. 9 illustrates an example of a programming operation for an odd page including memory cells of first and third cell strings CS1 and CS3 of FIG. 2 among memory cells coupled to a selected wordline. In the example of FIG. 9, among the memory cells included in the odd page, a memory cell of the first cell string CS1 of FIG. 2 is programmed, and a memory cell of the third cell string CS3 of FIG. 2 is not programmed. For example, the memory cell of the third cell string CS3 may not be programmed since data corresponding to an erased state is to be stored in the memory cell or the memory cell already has a threshold voltage greater than or equal to a verify voltage corresponding to the data to be stored in the memory cell.

Referring to FIG. 9, to perform the odd page programming operation, a power supply voltage VCC may be applied to a first string select line SSL1, and a ground voltage VSS may be applied to a second string select line SSL2. Thus, first and fifth string select transistors SST1 and SST5 of an enhancement mode type included in first and third cell strings CS1 and CS3 may be turned on, and fourth and eighth string select transistors SST4 and SST8 of the enhancement mode type included in second and fourth cell strings CS2 and CS4 may be turned off. Accordingly, the first and third cell strings CS1 and CS3 may be selected, and the second and fourth cell strings CS2 and CS4 may not be selected. Further, a voltage V2 greater than the ground voltage VSS and less than the power supply voltage VCC may be applied to the first bitline BL1 to program a memory cell included in the first cell string CS1, and the power supply voltage VCC may be applied to the second bitline BL2 so as not to program a memory cell included in the third cell string CS3. Accordingly, a first channel of the selected first cell string CS1 may have the voltage V2 greater than the ground voltage VSS and less than the power supply voltage VCC, and a third channel of the selected third cell string CS3 may be precharged by the power supply voltage VCC applied through the second bitline BL2. The fifth string select transistor SST5 of the enhancement mode type may be cut off, and may be in a floating state. Second and fourth channels of the unselected second and fourth cell strings CS2 and CS4 may not be precharged, and may be in the floating state by the turned-off fourth and eighth string select transistors SST4 and SST8 of the enhancement mode type.

If a pass voltage VPASS is applied to a plurality of wordlines WL1, WL2, WL3 and WLN, the second through fourth channels of the second through fourth cell strings CS2, CS3 and CS4 in the floating state may be boosted by coupling with the plurality of wordlines WL1, WL2, WL3 and WLN. In some example embodiments, since the second and fourth channels of the second and fourth cell strings CS2 and CS4 are not precharged, a boosted voltage VBSTD' of the second and fourth channels of the second and fourth cell strings CS2 and CS4 that are boosted without being precharged may be less than a boosted voltage VBSTD of the third channel of the third cell string CS3 that is boosted after being precharged. After the second through fourth channels of the second through fourth cell strings CS2, CS3 and CS4 are boosted, the memory cell included in the first cell string CS1 may be programmed by applying a programming voltage VPGM to the selected wordline.

As described above, in a method of programming a nonvolatile memory device according to example embodiments, since the voltage V2 greater than the ground voltage VSS is applied to the first bitline BL1 coupled to the first cell string CS1 including the memory cell to be programmed, the leakage current of the unselected second cell string CS2 coupled to the first bitline BL1 may be reduced, and the voltage VCH2 of the second channel of the second cell string CS2 may not be decreased by the leakage current. In addition, since the first channel of the first cell string CS1 has the voltage V2 greater than the ground voltage VSS, the voltage VCH2 of the second channel of the second cell string CS2 may be less affected by the coupling with the first channel of the first cell string CS1.

Figure 10:
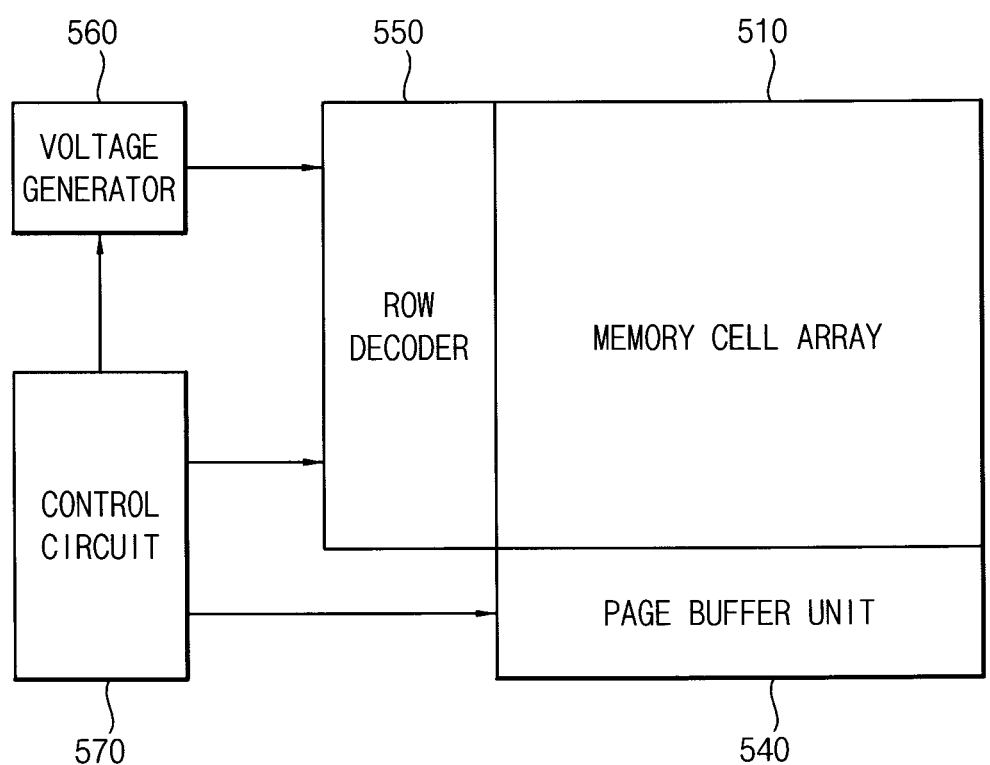
FIG. 10 is a block diagram illustrating a nonvolatile memory device according to example embodiments.

FIG. 10 is a block diagram illustrating a nonvolatile memory device according to example embodiments.

Referring to FIG. 10, a nonvolatile memory device 500 includes a memory cell array 510, a page buffer unit 540, a row decoder 550, a voltage generator 560 and a control circuit 570.

Memory cell array 510 may have a shared bitline structure including at least two cell strings per bitline. For example, memory cell array 510 may be memory cell array 200 of FIG. 2, or may be memory cell array 300 of FIG. 5. According to example embodiments, th memory cell array 510 may include a single level cell (SLC) that stores data of one bit per memory cell, or may include a multi-level cell (MLC) that stores data of two or more bits per memory cell. Further, according to example embodiments, memory cells included in memory cell array 510 may have various cell structures, such as a charge trapping flash structure, a stacked flash structure, a finned flash structure, or a flash structure without source and drain, to name but a few.

Page buffer unit 540 may operate as write drivers or sense amplifiers according to operation modes. For example, page buffer unit 540 may operate as the sense amplifiers in a read mode, and may operate as the write drivers in a write mode. Page buffer unit 540 may include a plurality of page buffers respectively coupled to a plurality of bitlines. The plurality of page buffers may temporarily store data.

Row decoder 550 may select a wordline in response to a row address. The row decoder 550 may apply wordline voltages from voltage generator 560 to selected and unselected wordlines. For example, during a programming operation, row decoder 550 may apply a programming voltage to the selected wordline, and may apply a pass voltage to the unselected wordlines.

Voltage generator 560 may be controlled by control circuit 570 to generate the wordline voltages, such as the programming voltage, the pass voltage, a verify voltage, a read voltage, etc.

Control circuit 570 may control page buffer unit 540, row decoder 550 and voltage generator 560 to program data to memory cell array 510.

In a method of programming nonvolatile memory device 500 according to example embodiments as disclosed herein, nonvolatile memory device 500 may precharge not only a channel of a selected cell string but also a channel of an unselected cell string. Accordingly, a voltage of the channel of the unselected cell string may be sufficiently boosted, and a programming disturbance may be prevented. Further, in the method of programming nonvolatile memory device 500 according to example embodiments disclosed herein, a voltage greater than a ground voltage may be applied to a bitline coupled to the selected cell string including a memory cell to be programmed. Accordingly, a leakage current of the unselected cell string coupled to the bitline may be reduced, and thus the programming disturbance may be further prevented since the channel of the unselected cell string may be sufficiently boosted.

Figure 11:
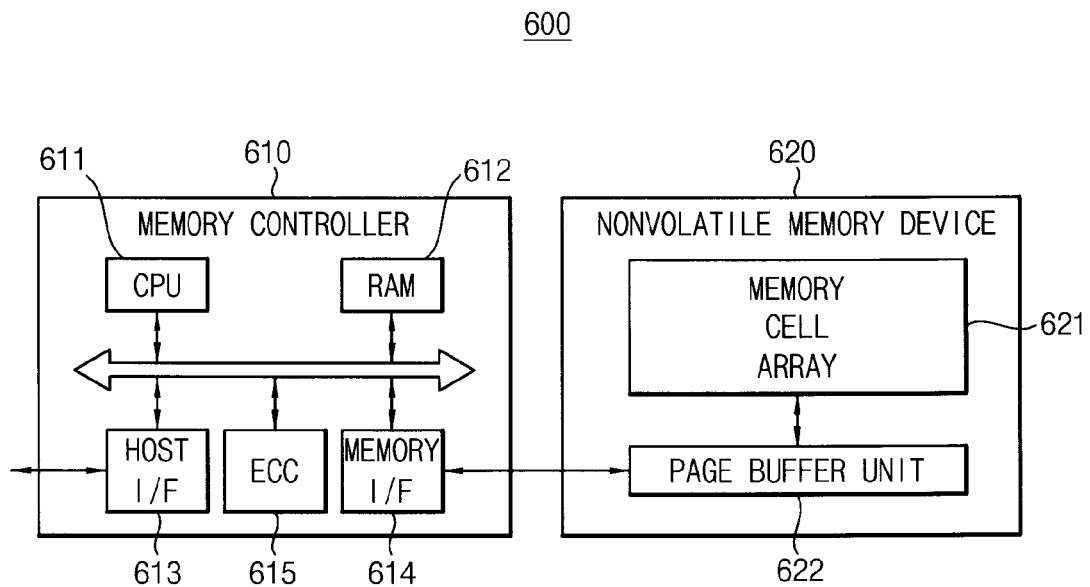
FIG. 11 is a block diagram illustrating a memory system according to example embodiments.

FIG. 11 is a block diagram illustrating a memory system 600 according to example embodiments.

Referring to FIG. 11, memory system 600 includes a memory controller 610 and a nonvolatile memory device 620.

Nonvolatile memory device 620 includes a memory cell array 621 and a page buffer unit 622. Page buffer unit 622 may include page buffers coupled to bitlines and temporarily storing data. Memory cell array 621 may have a shared bitline structure including at least two cell strings per bitline. During a programming operation, not only a channel of a selected cell string but also a channel of an unselected cell string may be precharged. Accordingly, a voltage of the channel of the unselected cell string may be sufficiently boosted, and a programming disturbance may be prevented. Further, during the programming operation, the nonvolatile memory device 620 may apply a voltage greater than a ground voltage to a bitline coupled to the selected cell string including a memory cell to be programmed. Accordingly, a leakage current of the unselected cell string coupled to the bitline may be reduced, and thus the programming disturbance may be further prevented since the channel of the unselected cell string may be sufficiently boosted.

Memory controller 610 may control nonvolatile memory device 620. Memory controller 610 may control data transfer between an external host (not shown) and nonvolatile memory device 620. Memory controller 610 may include a central processing unit (CPU) 611, a buffer memory 612, a host interface 613 and a memory interface 614. Central processing unit 611 may perform operations for the data transfer. Buffer memory 612 may be implemented by a dynamic random access memory (DRAM), a static random access memory (SRAM), a phase random access memory (PRAM), a ferroelectric random access memory (FRAM), a resistive random access memory (RRAM), a magnetic random access memory (MRAM), etc. According to example embodiments, buffer memory 612 may be located inside or outside memory controller 610.

Host interface 613 may be coupled to the external host, and memory interface 614 may be coupled to nonvolatile memory device 620. Central processing unit 611 may communicate with the external host via host interface 613. For example, host interface 613 may be configured to communicate with the external host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, central processing unit 611 may communicate with nonvolatile memory device 620 via memory interface 614. In some example embodiments, memory controller 610 may further include an error correction block 615 for error correction. According to example embodiments, memory controller 610 may be built in nonvolatile memory device 620, or memory controller 610 and nonvolatile memory device 620 may be implemented as separate chips.

Memory system 600 may be implemented as a memory card, a solid state drive, etc. In some example embodiments, nonvolatile memory device 620, memory controller 610 and/or memory system 600 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 12:
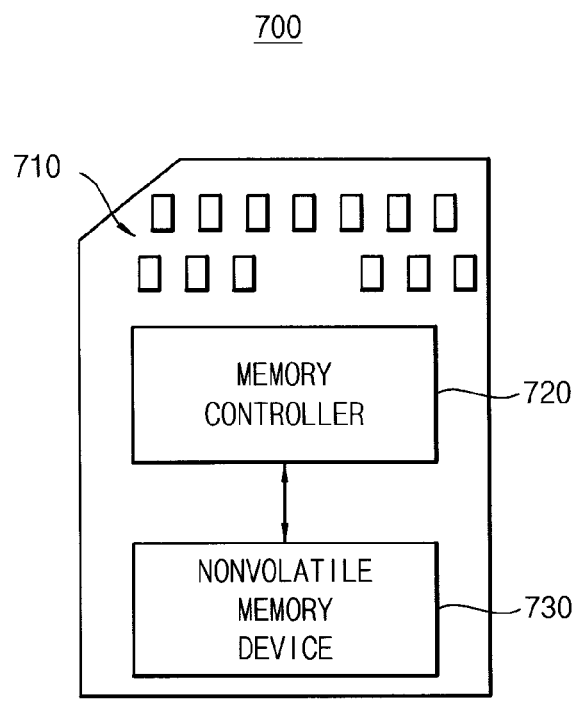
FIG. 12 is a diagram illustrating a memory card including a memory system according to example embodiments.

FIG. 12 is a diagram illustrating a memory card 700 including a memory system according to example embodiments.

Referring to FIG. 12, memory card 700 may include a plurality of connecting pins 710, a memory controller 720 and a nonvolatile memory device 730.

Connecting pins 710 may be coupled to a host (not shown) to transfer signals between the host and memory card 700. Connecting pins 710 may include a clock pin, a command pin, a data pin and/or a reset pin.

Memory controller 720 may receive data from the external host, and may store the received data in nonvolatile memory device 730.

Nonvolatile memory device 730 may have a shared bitline structure including at least two cell strings per bitline. During a programming operation, not only a channel of a selected cell string but also a channel of an unselected cell string may be precharged. Accordingly, a voltage of the channel of the unselected cell string may be sufficiently boosted, and a programming disturbance may be prevented. Further, during the programming operation, the nonvolatile memory device 730 may apply a voltage greater than a ground voltage to a bitline coupled to the selected cell string including a memory cell to be programmed. Accordingly, a leakage current of the unselected cell string coupled to the bitline may be reduced, and thus the programming disturbance may be further prevented since the channel of the unselected cell string may be sufficiently boosted.

For example, memory card 700 may include a multimedia card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In some example embodiments, memory card 700 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 13:
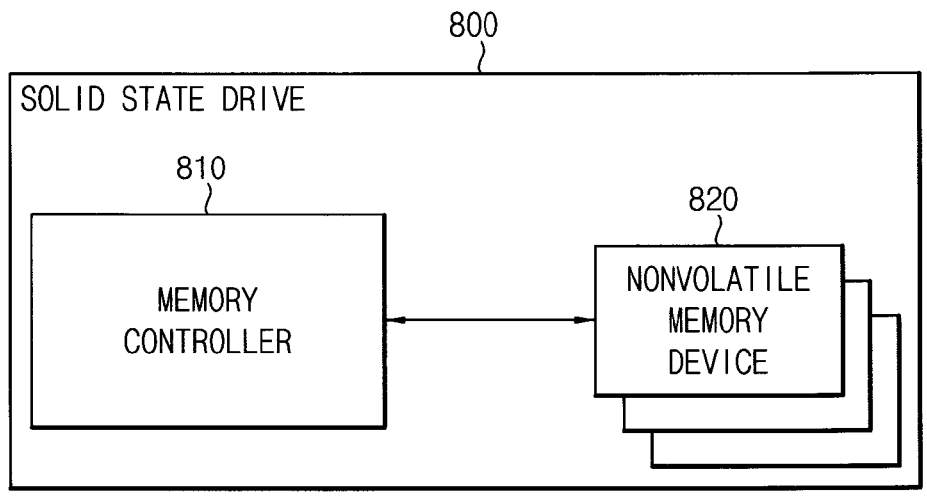
FIG. 13 is a diagram illustrating a solid state drive including a memory system according to example embodiments.

FIG. 13 is a diagram illustrating a solid state drive 800 including a memory system according to example embodiments.

Referring to FIG. 13, solid state drive (SSD) 800 includes a memory controller 810 and a plurality of nonvolatile memory devices 820.

Memory controller 810 may receive data from a host (not shown). Memory controller 810 may store the received data in the plurality of nonvolatile memory devices 820.

Each nonvolatile memory device 820 may have a shared bitline structure including at least two cell strings per bitline. During a programming operation, not only a channel of a selected cell string but also a channel of an unselected cell string may be precharged. Accordingly, a voltage of the channel of the unselected cell string may be sufficiently boosted, and a programming disturbance may be prevented. Further, during the programming operation, nonvolatile memory device 820 may apply a voltage greater than a ground voltage to a bitline coupled to the selected cell string including a memory cell to be programmed. Accordingly, a leakage current of the unselected cell string coupled to the bitline may be reduced, and thus the programming disturbance may be further prevented since the channel of the unselected cell string may be sufficiently boosted.

In some example embodiments, solid state drive 800 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 14:
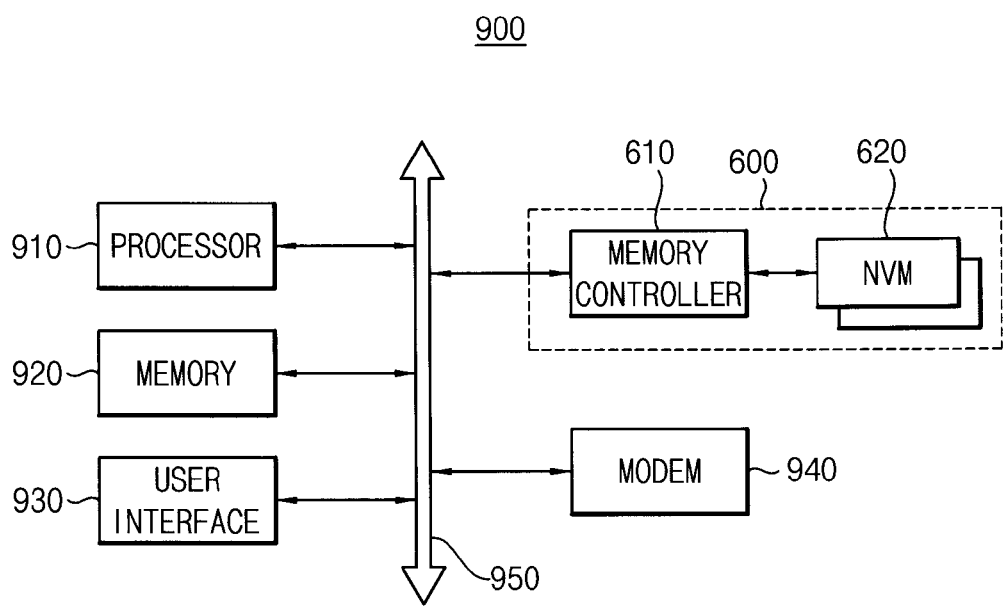
FIG. 14 is a diagram illustrating a computing system according to example embodiments.

FIG. 14 is a diagram illustrating a computing system 900 according to example embodiments.

Referring to FIG. 14, computing system 900 includes a processor 910, a memory device 920, a user interface 930 and a memory system 600. In some example embodiments, the computing system 900 may further include a modem 940, such as a baseband chipset.

Processor 910 may perform specific calculations or tasks. For example, processor 910 may be a microprocessor, a central processing unit (CPU), a digital signal processor, or the like. Processor 910 may be coupled to memory device 920 via a bus 950, such as an address bus, a control bus and/or a data bus. For example, memory device 920 may be implemented by a DRAM, a mobile DRAM, a SRAM, a PRAM, a FRAM, a RRAM, a MRAM and/or a flash memory. Further, processor 910 may be coupled to an extension bus, such as a peripheral component interconnect (PCI) bus, and may control user interface 930 including at least one input device, such as a keyboard, a mouse, a touch screen, etc., and at least one output device, a printer, a display device, etc. Modem 940 may perform wired or wireless communication with an external device. Nonvolatile memory device 620 may be controlled by memory controller 610 to store data processed by processor 910 or data received via modem 940. In some example embodiments, computing system 900 may further include a power supply, an application chipset, a camera image processor (CIS), etc.

The inventive concept may be applied to any nonvolatile memory device having a shared bitline structure, and devices and systems including the nonvolatile memory device. For example, the inventive concept may be applied to various electronic devices, such as a memory card, a solid state drive, a desktop computer, a laptop computer, a tablet computer, a mobile phone, a smart phone, a music player, a PDA, a PMP, a digital television, a digital camera, a portable game console, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming a nonvolatile memory device including first and second cell strings that are coupled to one bitline, the method comprising:
    precharging a first channel of the first cell string and a second channel of the second cell string by applying a first voltage to the bitline;
    selecting one cell string from the first and second cell strings; and
    programming a memory cell included in the selected cell string by applying to the bitline a second voltage greater than a ground voltage and less than the first voltage,
    wherein the first channel of the first cell string and the second channel of the second cell string are precharged to a precharge voltage level, and
    wherein, when the memory cell included in the selected cell string is programmed, a voltage of a channel of the selected cell string decreases to a voltage level that is less than the precharge voltage level, and a voltage of a channel of an unselected cell string increases to a boosted voltage level greater than the precharge voltage level.

2. The method of claim 1, wherein the first voltage is a power supply voltage, and
    wherein the second voltage is greater than the ground voltage and less than the power supply voltage.

3. The method of claim 1, wherein the first cell string includes a first string select transistor of an enhancement mode type coupled to a first string select line, a second string select transistor of a depletion mode type coupled to a second string select line, and a plurality of first memory cells respectively coupled to a plurality of wordlines, and
    wherein the second cell string includes a third string select transistor of the depletion mode type coupled to the first string select line, a fourth string select transistor of the enhancement mode type coupled to the second string select line, and a plurality of second memory cells respectively coupled to the plurality of wordlines.

4. The method of claim 3, wherein precharging the first channel of the first cell string and the second channel of the second cell string comprises:
    applying a power supply voltage as the first voltage to the bitline;
    turning on the first string select transistor and the third string select transistor by applying the power supply voltage to the first string select line; and
    turning on the second string select transistor and the fourth string select transistor by applying the power supply voltage to the second string select line.

5. The method of claim 3, wherein selecting the one cell string from the first and second cell strings comprises:
    turning on the first string select transistor and the second string select transistor by applying a power supply voltage to the first string select line and the ground voltage to the second string select line if one of the first memory cells included in the first cell string is to be programmed; and
    turning on the third string select transistor and the fourth string select transistor by applying the ground voltage to the first string select line and the power supply voltage to the second string select line if one of the second memory cells included in the second cell string is to be programmed.

6. The method of claim 3, wherein the nonvolatile memory device further includes third and fourth cell strings that are coupled to another bitline adjacent to the bitline coupled to the first and second cell strings,
    wherein the third cell string includes a fifth string select transistor of the enhancement mode type coupled to the first string select line, a sixth string select transistor of the depletion mode type coupled to the second string select line, and a plurality of third memory cells respectively coupled to the plurality of wordlines, and
    wherein the fourth cell string includes a seventh string select transistor of the depletion mode type coupled to the first string select line, an eighth string select transistor of the enhancement mode type coupled to the second string select line, and a plurality of fourth memory cells respectively coupled to the plurality of wordlines.

7. The method of claim 3, wherein the nonvolatile memory device further includes third and fourth cell strings that are coupled to another bitline adjacent to the bitline coupled to the first and second cell strings,
    wherein the third cell string includes a fifth string select transistor of the depletion mode type coupled to the first string select line, a sixth string select transistor of the enhancement mode type coupled to the second string select line, and a plurality of third memory cells respectively coupled to the plurality of wordlines, and
    wherein the fourth cell string includes a seventh string select transistor of the enhancement mode type coupled to the first string select line, an eighth string select transistor of the depletion mode type coupled to the second string select line, and a plurality of fourth memory cells respectively coupled to the plurality of wordlines.

8. The method of claim 3, wherein programming the memory cell included in the selected cell string comprises:
    applying a voltage greater than the ground voltage and less than a power supply voltage as the second voltage to the bitline;

applying a pass voltage to unselected wordlines that are not coupled to the memory cell among a plurality of wordlines; and applying a programming voltage to a selected wordline that is coupled to the memory cell among the plurality of wordlines.

9. A method of programming a nonvolatile memory device including first and second cell strings that are coupled to a first bitline, a first string select line and a second string select line, the method comprising:

precharging a first channel of the first cell string and a second channel of the second cell string by applying a power supply voltage to the first bitline, the first string select line and the second string select line;

selecting one cell string from the first and second cell strings by applying the power supply voltage to one of the first string select line and the second string select line and by applying a ground voltage to the other one of the first string select line and the second string select line; and programming a memory cell included in the selected cell string by applying to the first bitline a voltage greater than the ground voltage and less than the power supply voltage.

10. The method of claim 9, wherein the first cell string includes a first string select transistor of an enhancement mode type coupled to the first string select line, a second string select transistor of a depletion mode type coupled to the second string select line, and a plurality of first memory cells respectively coupled to a plurality of wordlines, and wherein the second cell string includes a third string select transistor of the depletion mode type coupled to the first string select line, a fourth string select transistor of the enhancement mode type coupled to the second string select line, and a plurality of second memory cells respectively coupled to the plurality of wordlines.

11. The method of claim 10, wherein the nonvolatile memory device further includes third and fourth cell strings that are coupled to a second bitline adjacent to the first bitline, wherein the third cell string includes a fifth string select transistor of the enhancement mode type coupled to the first string select line, a sixth string select transistor of the depletion mode type coupled to the second string select line, and a plurality of third memory cells respectively coupled to the plurality of wordlines, and wherein the fourth cell string includes a seventh string select transistor of the depletion mode type coupled to the first string select line, an eighth string select transistor of the enhancement mode type coupled to the second string select line, and a plurality of fourth memory cells respectively coupled to the plurality of wordlines.

12. The method of claim 11, wherein the first memory cells of the first cell string and the third memory cells of the third cell string are configured to form odd pages, and the second memory cells of the second cell string and the fourth memory cells of the fourth cell string are configured to form even pages.

13. The method of claim 10, wherein the nonvolatile memory device further includes third and fourth cell strings that are coupled to a second bitline adjacent to the first bitline, wherein the third cell string includes a fifth string select transistor of the depletion mode type coupled to the first string select line, a sixth string select transistor of the enhancement mode type coupled to the second string select line, and a plurality of third memory cells respectively coupled to the plurality of wordlines, and wherein the fourth cell string includes a seventh string select transistor of the enhancement mode type coupled to the first string select line, an eighth string select transistor of the depletion mode type coupled to the second string select line, and a plurality of fourth memory cells respectively coupled to the plurality of wordlines.

14. The method of claim 13, wherein the first memory cells of the first cell string and the fourth memory cells of the fourth cell string are configured to form odd pages, and the second memory cells of the second cell string and the third memory cells of the third cell string are configured to form even pages.

* * * * *